(12) United States Patent
Fujita

(10) Patent No.: US 7,539,069 B2
(45) Date of Patent: May 26, 2009

(54) SEMICONDUCTOR MEMORY DEVICE

(75) Inventor: Katsuyuki Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 11/748,187

(22) Filed: May 14, 2007

(65) Prior Publication Data

US 2007/0279979 A1 Dec. 6, 2007

(30) Foreign Application Priority Data

May 30, 2006 (JP) .............................. 2006-150292

(51) Int. Cl.
*G11C 7/00* (2006.01)
(52) U.S. Cl. .................. 365/189.16; 365/177; 365/205; 365/230.03
(58) Field of Classification Search ................. 365/177, 365/189.16, 250, 230.03
See application file for complete search history.

(56) References Cited

U.S. PATENT DOCUMENTS

| 5,790,467 | A | * | 8/1998 | Haukness et al. ........... 365/205 |
| 6,567,330 | B2 | | 5/2003 | Fujita et al. |
| 7,139,208 | B2 | * | 11/2006 | Arimoto et al. ............. 365/222 |
| 2005/0232043 | A1 | | 10/2005 | Ohsawa |
| 2006/0274590 | A1 | | 12/2006 | Fujita et al. |
| 2008/0198673 | A1 | * | 8/2008 | Fujita ..................... 365/189.11 |
| 2008/0212377 | A1 | * | 9/2008 | Fujita ..................... 365/189.05 |

FOREIGN PATENT DOCUMENTS

JP 2005-302234 10/2005

OTHER PUBLICATIONS

U.S. Appl. No. 12/034,985, filed Feb. 21, 2008, Fujita.
Takashi Ohsawa, et al., "An 18.5ns 128Mb SOI DRAM with a Floating Body Cell", Dig. Tech. Papers, IEEE International Solid-State Circuits Conference, ISSCC, Session 25, Dynamic Memory, 25.1, Feb. 2005, 3 pages.
U.S. Appl. No. 12/033,258, filed Feb. 19, 2008, Fujita.

* cited by examiner

*Primary Examiner*—Hoai V Ho
(74) *Attorney, Agent, or Firm*—Oblon, Spivak, McClelland, Maier & Neustadt, P.C.

(57) ABSTRACT

This disclosure concerns a memory comprising a memory cell; a first and a second sense nodes transmitting the data on the first and the second bit lines which transmits data with reversed polarities from each other; a first transfer gate provided between the first bit line and the first sense node; a second transfer gate provided between the second bit line and the second sense node; a latch circuit provided between the first and the second sense nodes; a write signal line activated when the data is written or restore to the cell; and a gate circuit connecting the write signal line to the first bit line and the first sense node to the second bit line, or connecting the write signal line to the second bit line and the second sense node to the first bit line, when the data is written or restore.

9 Claims, 19 Drawing Sheets

FIRST EMBODIMENT

FIG. 3 FIRST EMBODIMENT

SECOND EMBODIMENT

THIRD EMBODIMENT

FOURTH EMBODIMENT

FIFTH EMBODIMENT

DATA WRITE OPERATION, REFRESH OPERATION

SIXTH EMBODIMENT

SEVENTH EMBODIMENT

NINTH EMBODIMENT

SEMICONDUCTOR MEMORY DEVICE

CROSS-REFERENCE TO RELATED APPLICATION

This application is based upon and claims the benefit of priority from the prior Japanese Patent Application No. 2006-150292, filed on May 30, 2006, the entire contents of which are incorporated herein by reference.

BACKGROUND OF THE INVENTION

1. Field of the Invention

The present invention relates to a semiconductor memory device, e.g., a sense amplifier of an FBC (Floating Body Cell).

2. Related Art

Recently, there has been known an FBC memory device as a semiconductor memory device expected to replace a DRAM. The FBC is configured by an FET (Field Effect Transistor) that includes a floating body (hereinafter, also "body region") provided in an SOI (Silicon On Insulator). The FBC stores therein either data "1" or data "0" according to the number of majority carriers stored in the body region.

A sense amplifier employed in the FBC includes a pair of sense nodes (hereinafter, "paired sense nodes") that senses data with reversed polarities from each other. The sense amplifier also includes a latch circuit between the paired sense nodes. The latch circuit latches data from a memory cell onto the paired sense nodes via a pair of bit lines (hereinafter, "paired bit lines") in a state where the respective data is logically inverted from each other. It is, therefore, necessary for the sense amplifier to invert the data latched onto the paired sense nodes before writing back the data to the memory cell when the latched data is to be written back to the memory cell.

To this end, the conventional sense amplifier includes a restoration-specific transfer gate between the paired bit lines and the paired sense nodes so as to reverse the connection relationship between the paired bit lines and the paired sense nodes during a data write operation from that during a data read operation.

Generally, the latch circuit is constituted by two transistors cross-coupled to the paired sense nodes, respectively. In order to ensure writing data to the memory cell, it is required to enhance a current driving capability of each of the transistors that constitute the latch circuit. In other words, a size (W/L) of each of the transistors that constitute the latch circuit should be enlarged. To enlarge the size (W/L), it suffices to expand a gate width W or to reduce a gate length L of each transistor.

However, during a data restoration operation, the data is written to the memory cell via both the transistors that constitute the latch circuit and the restoration-specific transfer gate. As a result, a total gate length is increased. Accordingly, it is required to increase gate widths W of the transistors and the transfer gate. This disadvantageously makes areas of the transistors larger.

If the areas of the transistors are larger, an occupation area of the sense amplifier is larger. Because the sense amplifier is provided for every pair of bit lines, the overall FBC memory device is disadvantageously made larger in size if the occupation area of the sense amplifier is larger.

SUMMARY OF THE INVENTION

A semiconductor memory device according to an embodiment of the present invention comprises a memory cell including a floating body in an electrically floating state and storing data according to number of majority carries in the floating body; a first bit line and a second bit line connected to the memory cell and transmitting data with reversed polarities from each other; a first sense node and a second sense node transmitting the data on the first bit line and the data on the second bit line, respectively; a first transfer gate provided between the first bit line and the first sense node; a second transfer gate provided between the second bit line and the second sense node; a latch circuit provided between the first sense node and the second sense node; a write signal line activated when the data is written or written back to the memory cell; and a gate circuit connecting the write signal line to the first bit line and the first sense node to the second bit line, or connecting the write signal line to the second bit line and the second sense node to the first bit line, when the data is written or written back to the memory cell.

A semiconductor memory device according to an embodiment of the present invention comprises a memory cell including a floating body in an electrically floating state and storing data according to number of majority carries in the floating body; a first bit line and a second bit line connected to the memory cell and transmitting data with reversed polarities from each other; a first sense node and a second sense node transmitting the data on the first bit line and the data on the second bit line, respectively; a first transfer gate provided between the first bit line and the first sense node; a second transfer gate provided between the second bit line and the second sense node; a latch circuit provided between the first sense node and the second sense node; a first write signal line in a potential level when the data is written or written back to the memory cell; a second write signal line in a different potential level from the potential level of the first write signal line when the data is written or written back to the memory cell; and a gate circuit connecting the second write signal line to the first bit line or the second bit line after connecting the first write signal line to both of the first bit line and the second bit line, when the data is written or written back to the memory cell.

BRIEF DESCRIPTION OF THE DRAWINGS

FIG. 3 is a circuit diagram showing a configuration of each of the sense amplifiers S/As;

DETAILED DESCRIPTION OF THE INVENTION

Hereafter, embodiments of the present invention will be described with reference to the drawings. Note that the invention is not limited to the embodiments.

First Embodiment

Figure 1:
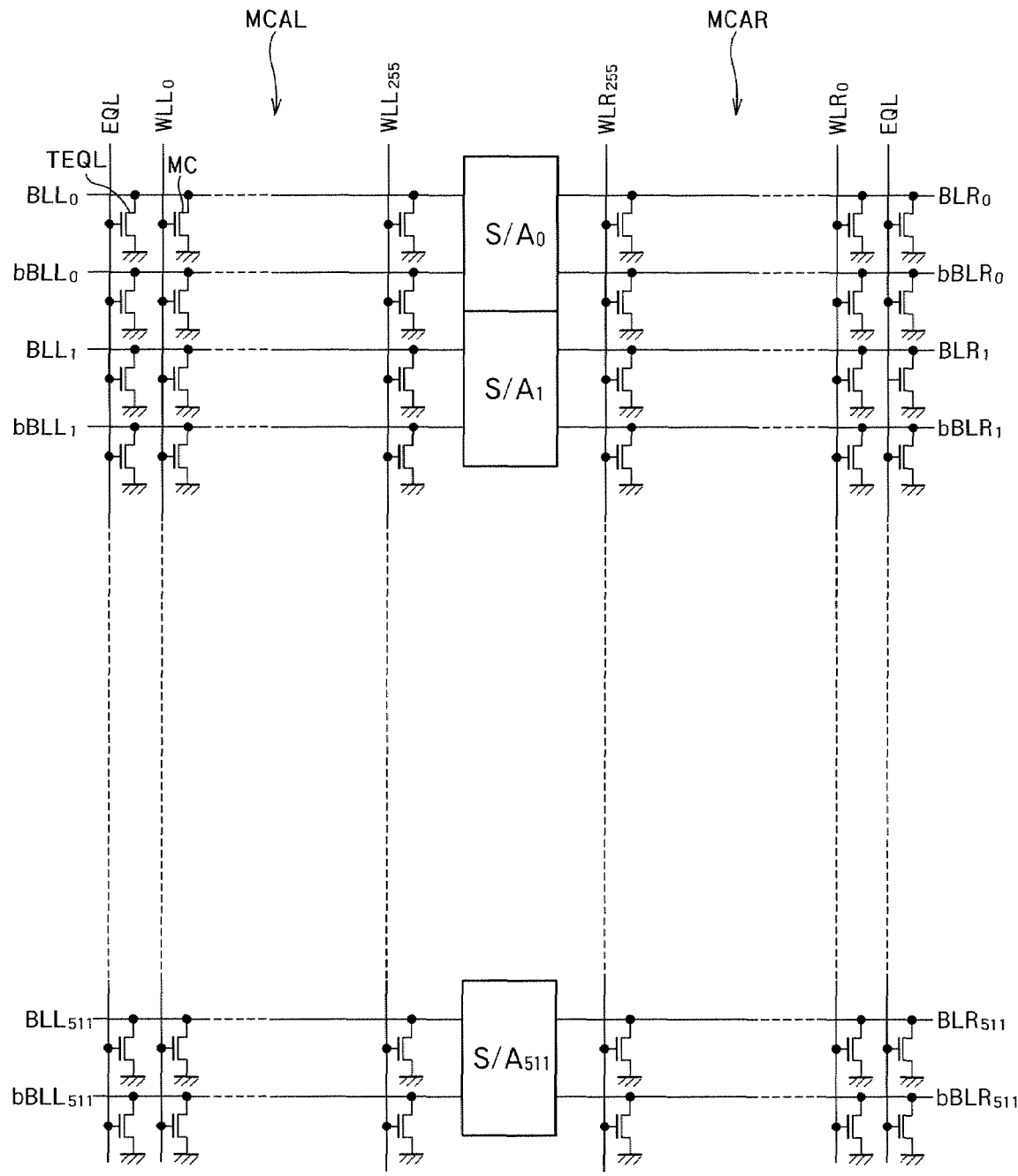
FIG. 1 is a circuit diagram showing a configuration of an FBC memory device according to a first embodiment of the present invention.

FIG. 1 is a circuit diagram showing a configuration of an FBC memory device according to a first embodiment of the present invention. The FBC memory device includes memory cells MC, sense amplifiers S/Ai (where i is an integer) (hereinafter, also "S/As"), word lines WLLi and WLRi (hereinafter, also "WLLs and WLRs"), bit lines BLLi and BLRi (hereinafter, also "BLLs and BLRs"), bit lines bBLLi and bBLRi (hereinafter, also bBLLs and bBLRs"), equalizing lines EQL, and equalizing transistors TEQL and TEQR (hereinafter, also "TEQs").

The FBC memory device according to the first embodiment adopts a two cell-bit structure. The two cell-bit structure is a structure in which one-bit data is stored in two memory cells MCs by writing data with reversed polarities to the two memory cells MCs connected to the paired bit lines BLL and bBLL or BLR and bBLR, respectively and adjacent to each other on the same word line. The data with reversed polarities is data in a complementary relationship such as a relationship between data "0" and "1". During a data read operation, one of the data with reversed polarities form basis for the other data, and the other data forms basis for one data. Accordingly, either the paired bit lines BLL and bBLL or BLR and bBLR transmit data with reversed polarities, respectively. In the first embodiment, it is assumed that the bit line BLL or BLR serves as a first bit line and the bit line bBLR or bBLR serves as a second bit line.

The memory cells MCs are arranged in a matrix and constitute memory cell arrays MCAL and MCAR (hereinafter, also "MCAs"). The word lines WLLs and WLRs extend in a row direction and connected to gates of the memory cells MCs. In the first embodiment, 256 word lines WLLs and 256 word lines WLRs are provided at the left and right of the sense amplifiers S/As, respectively. In FIG. 1, the word lines WLLs and WLRs are denoted by WLL0 to WLL255 and WLR0 to WLR255, respectively. The bit lines BLLs and BLRs extend in a column direction and connected to sources or drains of the memory cells MCs. In the first embodiment, 512 bit lines BLLs and 512 bit lines BLRs are provided at the left and right of the sense amplifiers S/As, respectively. In FIG. 1, the bit lines BLLs and BLRs are denoted by BLL0 to WLL511 and BLR0 to BLR511, respectively. The word lines BLLs and BLRs are orthogonal to the bit lines BLLs and BLRs and the memory cells MCs are provided at respective crossing points. The row direction can be replaced by the column direction.

The equalizing lines EQLs are connected to gates of the equalizing transistors TEQs. Each of the equalizing transistors TEQs is connected between the bit line BLL or BLR and a ground. During an equalizing operation, a potential of each of the bit lines BLLs and BLR is set equal to a ground potential by connecting the bit lines BLLs and BLRs to the ground.

Figure 2:
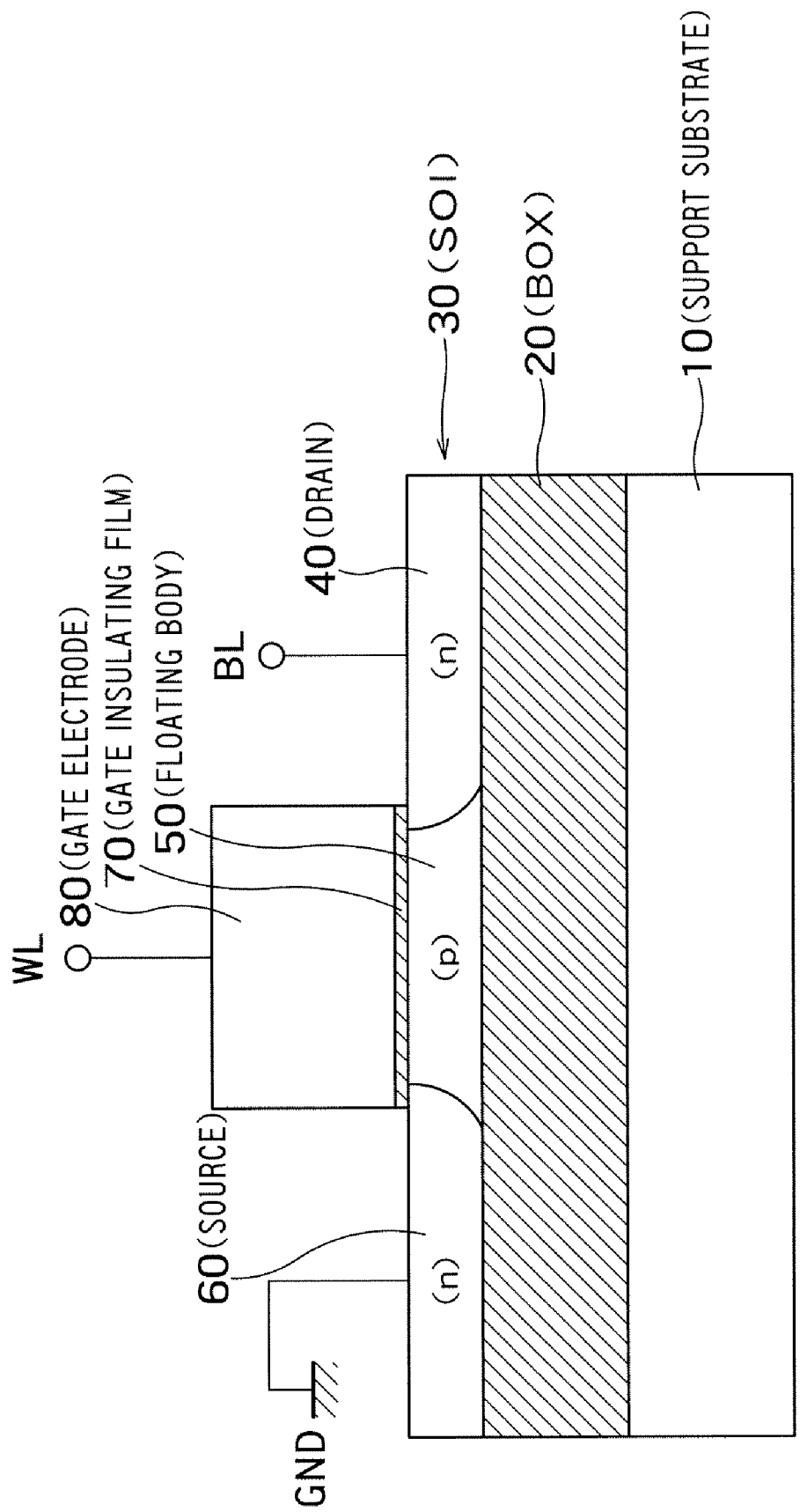
FIG. 2 is a cross-sectional view showing a structure of each of the memory cells MCs.

FIG. 2 is a cross-sectional view showing a structure of each of the memory cells MCs. The memory cell MC is provided on an SOI substrate including a support substrate 10, a BOX substrate 20, and an SOI layer 30. A source 60 and a drain 40 are formed in the SOI layer 30. A floating body 50 is formed on the SOI layer 30 between the source 60 and the drain 40. The floating body 50 is made of a semiconductor of a reversed conduction type from those of the source 60 and the drain 40. In the first embodiment, the memory cells MCs are N-type FETs. The floating body 50 is in an electrically floating state by being surrounded by the source 60, the drain 40, the BOX layer 20, a gate insulating film 70, and an STI (Shallow Trench Isolation) (not shown). The FBC memory cell can store therein data according to the number of majority carries in its floating body 50.

It is defined, for example, that the memory cell MC is an N-type MISFET. It is also defined that a first state where the number of holes stored in the floating body 50 is large corresponds to a state where the memory cell MC stores therein data "1" and that a second state where the number of holes stored in the floating body 50 is small corresponds to a state where the memory cell MC stores therein data "0".

To write the data "1" to the memory cell MC, the memory cell MC is caused to operate in a saturated state. The word line WL is biased to 1.5 V and the bit line BL is biased to 1.5V, for example. A potential of the source 60 is GND (0 V). By doing so, impact ionization occurs near the drain 40, which in turn generates many electron-hole pairs. The electrons generated by the impact ionization are carried into the drain 40 whereas the holes are accumulated in the floating body 50 lower in potential. If current applied when the holes are generated by the impact ionization is equal to forward current at a pn-junction between the floating body 50 and the source 60, a voltage of the floating body 50 ("body voltage") turns into an equilibrium state. The body voltage in the equilibrium state is about 0.7 V, for example.

To write the data "0" to the memory cell MC, the bit line BL is lowered to negative voltage. A potential of the bit line BL is lowered to, for example, −1.5 V. By doing so, the pn-junction between the floating body 50 and the drain 40 is greatly biased forward direction. The holes stored in the floating body 50 are emitted to the drain 40, whereby the data "0" is stored in the memory cell MC.

During a data read operation, the word line WL is activated similarly to the data write operation but a voltage applied to the bit line BL is set lower than a voltage applied when data "1" is to be written. For example, the voltage applied to the word line WL is set to 1.5 V and that applied to the bit line BL is set to 0.2 V. The memory cell MC is caused to operate in a linear region. The memory cell MC that stores therein the data "0" differs from the memory cell MC that stores therein the data "1" in threshold voltage on a basis of a difference of the number of holes accumulated in the body region 50 between the data "0" and the data "1". By detecting the difference in threshold voltage therebetween, it is discriminated whether data is "1" or "0". The reason for setting the voltage applied to the bit line BL low during the data read operation is as follows. If the voltage of the bit line BL is set high to bias the memory cell MC to turn the memory cell into the saturated state, the data "0" is changed to the data "1" due to the impact ionization when the data "0" is read.

Figure 3:
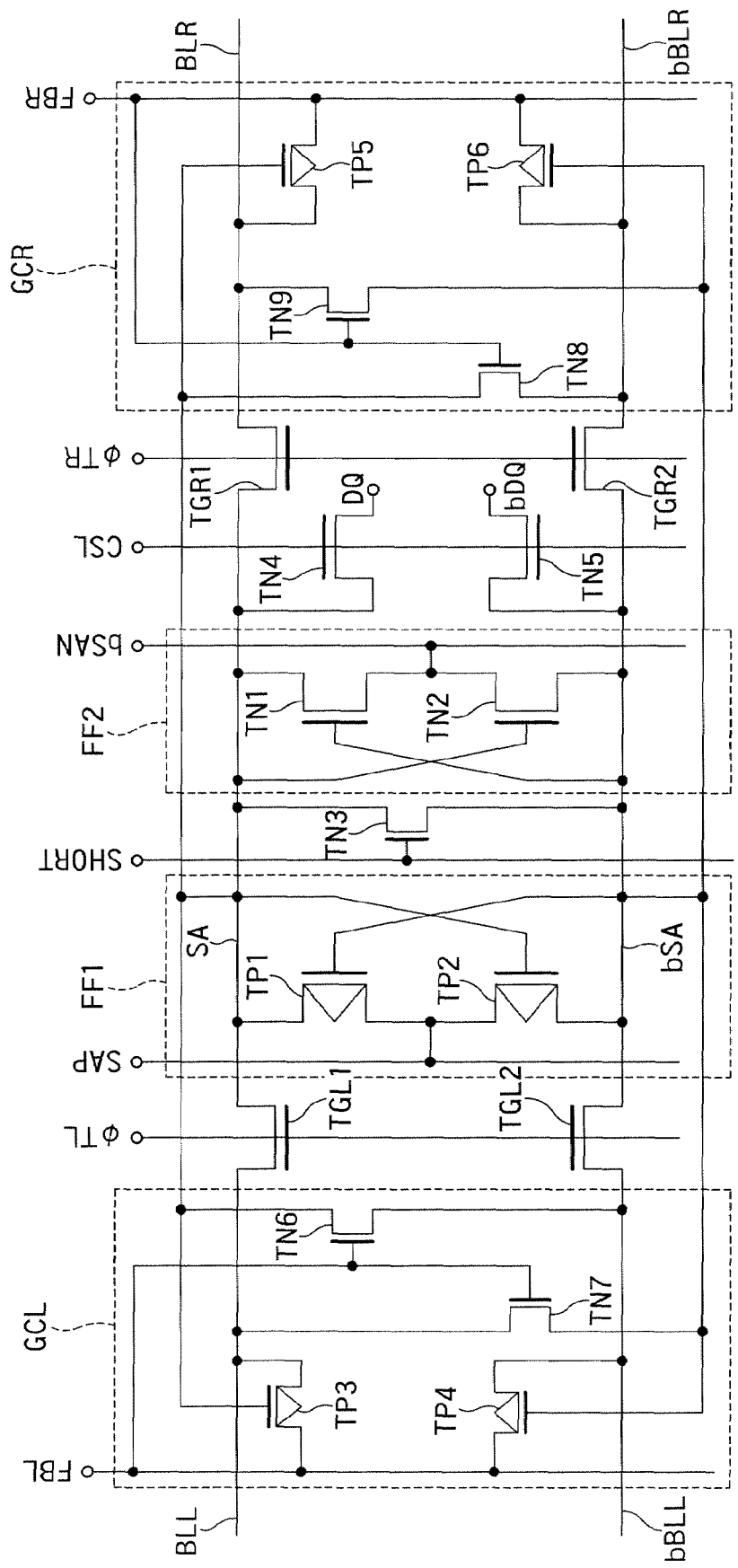

FIG. 3 is a circuit diagram showing a configuration of each of the sense amplifiers S/As. The sense amplifier S/A is connected to the paired bit lines BLL and bBLL and the paired bit lines BLR and bBLR provided at the left and right of the sense amplifier S/A, respectively, and provided to correspond to the two paired bit lines BLL, bBLL and BLR, bBLR. At the time of an actual data read/write operation, the sense amplifier S/A receives data from one of the two paired bit lines or transmits data to one of the two paired bit lines. At this time, the other paired bit lines are disconnected from a pair of sense nodes (hereinafter, "paired sense nodes") by transfer gates.

The sense amplifier S/A includes paired sense nodes SA and bSA. In the first embodiment, the sense node SA serves as a first sense node and the sense node bSA serves as a second sense node. The sense node SA is connected to the bit line BLL via a transfer gate TGL1 and to the bit line BLR via a transfer gate TGR1. The sense node bSA is connected to the bit line bBLL via a transfer gate TGL2 and to the bit line bBLR via a transfer gate TGR2. Each of the transfer gate TGL1, TGL2, TGR1, and TGR2 is constituted by an N-type FET.

The transfer gates TGL1 and TGL2 are controlled to be turned on/off by a signal ΦtL. The transfer gates TGR1 and TGR2 are controlled to be turned on/off by a signal ΦtR. During the data read or write operation, one of the signals ΦtL and ΦtR is activated and the other signal is deactivated.

"Activate" means turn on or drive an element or a circuit and "deactivate" means turn off or stop an element or a circuit. It is to be noted, therefore, that a HIGH (high potential level) signal is an active signal in one case and a LOW (low potential level) signal is an active signal in the other case. For example, an NMOS transistor is activated by making its gate HIGH. A PMOS transistor is activated by making its gate LOW.

The sense amplifier S/A also includes cross-coupled dynamic clutch circuits (hereinafter, "flip-flops") FF1 and FF2. The flip-flop FF1 is constituted by two p-type transistors TP1 and TP2 connected in series between sense nodes SA and bSA. A gate of the transistor TP1 is connected to the sense node bSA and a gate of the transistor TP2 is connected to the sense node SA. That is, the gates of the transistors TP1 and TP2 are cross-coupled to the sense nodes SA and bSA. The flip-flop FF2 is constituted by two n-type transistors TN1 and TN2 connected in series between the sense nodes SA and bSA. A gate of the transistor TN1 is connected to the sense node bSA and a gate of the transistor TN2 is connected to the sense node SA. That is, the gates of the transistors TN1 and TN2 are cross-coupled to the sense nodes SA and bSA. The flip-flops FF1 and FF2 are driven by activating signals SAP and bSAN, respectively. The flip-flops FF1 and FF2 amplify the potential difference between the paired sense nodes SA and bSA and latch the data.

An n-type transistor TN3 serving as a short circuiting switch is connected between the sense nodes SA and bSA and controlled by a signal SHORT. The transistor TN3 equalizes the sense nodes SA and bSA to each other by short-circuiting the sense nodes SA and bSA before the data read or write operation.

An n-type transistor TN4 is connected between a DQ line and the sense node SA, and an n-type transistor TN5 is connected between a bDQ line and the sense node bSA. Gates of the transistors TN4 and TN5 are connected to a column selection line CSL. The DQ line and the bDQ line are connected to a DQ buffer (not shown). The DQ buffer temporarily stores therein data from the memory cells MC to output the data to an outside during the data read operation, and temporarily stores therein data from the outside to transmit the data to the sense amplifier S/A during the data write operation. Therefore, the column selection line CSL is activated when the data is read to the outside or written from the outside, thereby making it possible to connect the sense nodes SA and bSA to the DQ buffer.

The sense amplifier S/A further includes write signal lines FBL and FBR to be activated when data is written to the memory cells MC and gate circuits GCL and GCR. The gate circuit GCL includes an n-type transistor TN6 provided between the sense node SA and the bit line bBLL, an n-type transistor TN7 provided between the sense node bSA and the bit line BLL, a p-type transistor TP3 provided between the write signal line FBL and the bit line BLL, and a p-type transistor TP4 provided between the write signal line FBL and the bit line bBLL.

The gate circuit GCR includes an n-type transistor TN8 provided between the sense node SA and the bit line bBLR, an n-type transistor TN9 provided between the sense node bSA and the bit line BLR, a p-type transistor TP5 provided between the write signal line FBR and the bit line BLR, and a p-type transistor TP6 provided between the write signal line FBR and the bit line bBLR.

Gates of the transistors TN6 and TN7 are connected to the write signal line FBL in common. Gates of the transistors TP3 and TP4 are connected to the sense nodes SA and bSA, respectively. Gates of the transistors TN8 and TN9 are connected to the write signal line FBR in common. Gates of the transistors TP5 and TP6 are connected to the sense nodes SA and bSA, respectively.

In the gate circuit GCL, an operation for writing the data "0" is executed by causing the transistor TN6 or TN7 to transmit a potential of the sense node SA or bSA to the bit line bBLL or BLL.

Further, in the gate circuit GCL, an operation for writing the data "1" is executed by causing the transistor TP3 or TP4 to transmit a potential of the write signal line FBL to the bit line bBLL or BLL based on potentials of the sense nodes SA and bSA instead of transmitting the potential of the sense node SA or bSA to the bit line bBLL or BLL as it is.

Likewise, in the gate circuit GCR, an operation for writing the data "0" is executed by causing the transistor TN8 or TN9 to transmit the potential of the sense node SA or bSA to the bit line bBLR or BLR.

Further, in the gate circuit GCR, an operation for writing the data "1" is executed by causing the transistor TP5 or TP6 to transmit a potential of the write signal line FBR to the bit line bBLR or BLR based on the potentials of the sense nodes SA and bSA instead of transmitting the potential of the sense node SA or bSA to the bit line bBLR or BLR as it is.

Although not shown in FIG. 3, a current-mirror type current load circuit can be connected to the paired sense nodes SA and bSA. This current load circuit is configured to apply a current to the two memory cells MCs connected to the paired bit lines, respectively during the data read operation.

Figure 4:
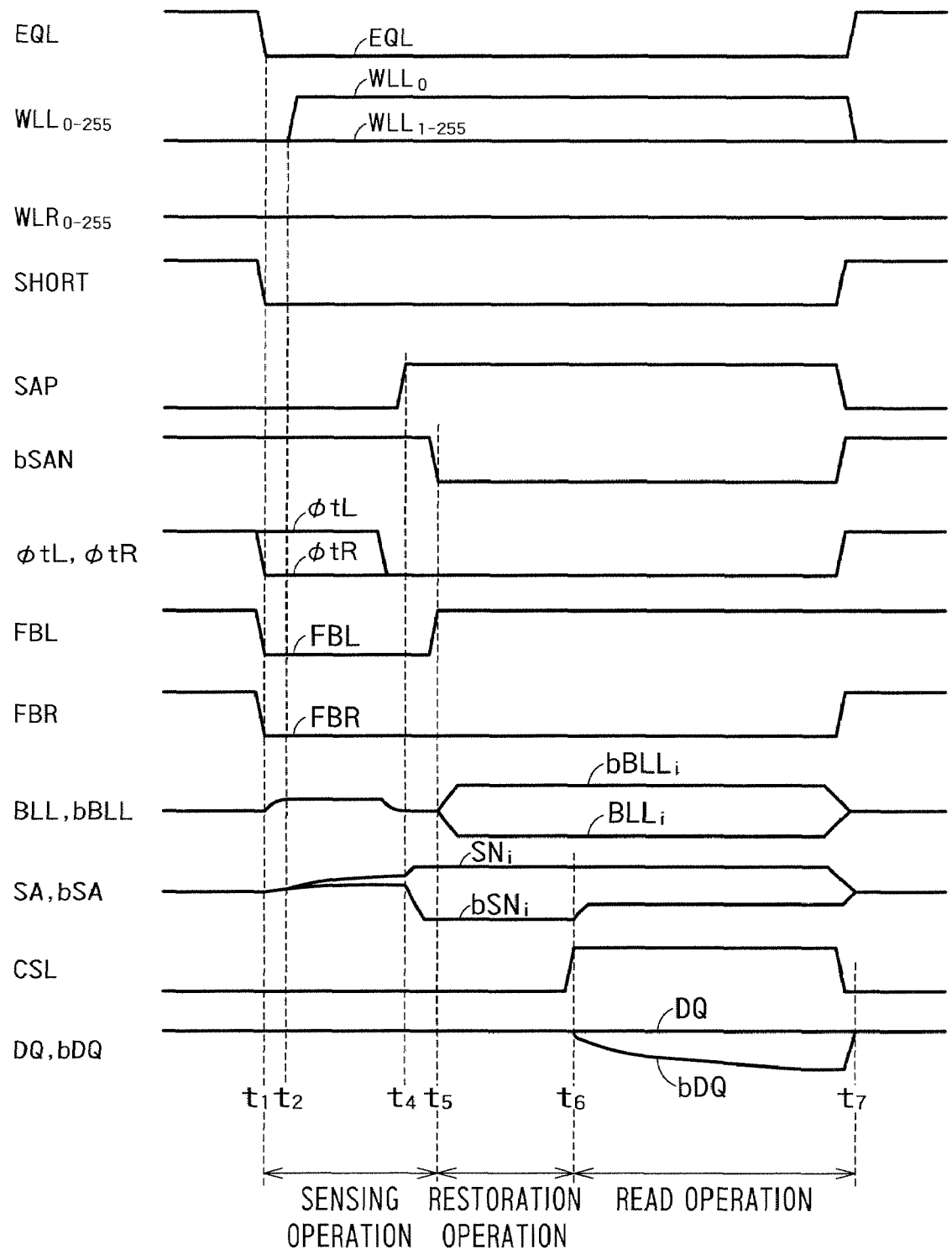
FIG. 4 is a timing chart showing the data read operation performed by each of the sense amplifiers S/As according to the first embodiment.

FIG. 4 is a timing chart showing the data read operation performed by each of the sense amplifiers S/As according to the first embodiment. In the first embodiment, it is assumed that data is read from the two memory cells MCs connected to the paired bit lines BLL and bBLL, respectively. Before t1, signals on the equalizing lines EQL (hereinafter, "signals EQLs") are activated to HIGH, whereby the paired bit lines BLL and bBLL and the paired bit lines BLR and bBLR are equalized to the ground potential. Furthermore, the transfer gates TGL1, TGR1, TGL2, and TGR2 are all activated, whereby the paired sense nodes SA and bSA are connected to the paired bit lines BLL and bBLL and the paired bit lines BLR and bBLR. Therefore, the paired sense nodes SA and bSA, the paired bit lines BLL and bBLL, and the paired bit lines BLR and bBLR are precharged with the ground potential.

At time t1, the signals EQLs are deactivated to LOW, thereby finishing precharging the paired sense nodes SA and bSA and the paired bit lines BLL and bBLL. At the same time, the signal SHORT is deactivated, thereby disconnecting the sense node SA from the sense node bSA.

The signal ΦtL is kept active and the signal ΦtR is deactivated. The transfer gates TGL1 and TGL2 are thereby are kept to be turned on while the transfer gates TGR1 and TGR2 are turned off. Namely, the paired sense nodes SA and bSA are disconnected from the paired bit lines BLR and bBLR while being kept connected to the paired bit lines BLL and bBLL.

By deactivating signals on the write signal lines FBL and FBR (hereinafter, "signals FBL and FBR") to LOW, the transistors TN6 to TN9 and TP3 to TP6 that constitute the gate circuits GCL and GCR are turned off.

At time t2, one of the word lines WLLs and WLRs is selected. In the first embodiment, the word line WLL0 in the memory cell array MCAL at the left of the sense amplifier S/A is selected. By activating the selected word line WLL0, data stored in the memory cells MCs connected to the selected word line WLL0 is transmitted to the paired sense nodes SA and bSA via the paired bit lines BLL and bBLL. In the first embodiment, the bit lines BLL and bBLL serve as the first bit line and the second bit line, respectively. Furthermore, the transfer gates TGL1 and TGL2 serve as a first transfer gate and a second transfer gate, respectively.

In these circumstances, an initial sensing operation starts. Current from the current load circuit is applied to the two memory cells MCs via the paired bit lines BLL an bBLL, respectively. The two memory cells MCs connected to the paired bit lines BLL and bBLL, respectively store therein data with reversed polarities from each other, so that potential difference is gradually generated between the sense nodes SA and bSA.

After the potential difference is generated (developed) between the sense nodes SA and bSA to some extent, the signals SAP and bSAN are activated to HIGH and LOW, respectively at time t4. The flip-flops FF1 and FF2 are thereby driven to amplify the potential difference between the paired sense nodes SA and bSA and to latch the data.

At time t5, the signal FBL is activated to HIGH. The transistors TN6 and TN7 that constitute the gate circuit GCL and that serve as a first transistor and a second transistor, respectively are thereby turned on. By turning on the first transistor TN6, the sense node SA is connected to the bit line bBLL. By turning on the second transistor TN7, the sense node bSA is connected to the bit line BLL.

It is assumed, for example, that the memory cell MC connected to the bit line BLL stores therein data "0" and that the memory cell MC connected to the bit line bBLL stores therein data "1". In this case, the potential of the sense node SA is HIGH and that of the sense node bSA is LOW after a latch operation. Therefore, the potential of the bit line BLL is made LOW via the first transistor TN6 whereas that of the bit line bBLL is made HIGH via the second transistor TN7. Moreover, the transistor TP3 serving as a third transistor is in an OFF state and the transistor TP4 serving as a fourth transistor is in an ON state. The write signal line FBL is connected to the bit line bBLL connected to the memory cell MC that stores therein the data "1" via the fourth transistor TP4. As a result, during a data restoration period between t5 and t6, the data "0" can be written to the memory cell MC connected to the bit line BLL by applying low potential (LOW) to the memory cell MC, and the data "1" can be written to the memory cell MC connected to the bit line bBLL by applying high potential (HIGH) to the memory cell MC.

To write the data "0" to the memory cell MC, it suffices to emit holes from the floating body 50 of the memory cell MC. Due to this, the sense amplifier S/A does not need so high current driving capability. On the other hand, to write the data "1" to the memory cell MC, it is required to store holes in the floating body 50 of the memory cell MC by producing the impact ionization. Due to this, the sense amplifier S/A needs relatively high current driving capability.

In the conventional sense amplifier, the potential of the signal SAP is connected to the bit line via the transistor that constitutes the latch circuit and the transistor that constitutes the transfer gate. Namely, the sense node transmits data to the bit line via the two transistors connected in series. It is assumed, for example, that the size of the transistor necessary to write data "1" is W/L, where W is gate width and L is gate length. If the size of one transistor is W/L, the total size of the two transistors connected in series is W/2L. The size of each of the two transistors is half the necessary size. Such a transistor has insufficient current driving capability to make it difficult to write the data "1". As a result, it is necessary to increase the current driving capabilities of the respective transistors by doubling the gate width W of each of the transistors. That is, it is necessary to set the total gate width to 2W+2W=4W. A total area of the two transistors is 4W×2L=8WL.

In the sense amplifier S/A according to the first embodiment, by contrast, the operation for writing the data "0" is executed by using the potential of the sense node; however, the operation for writing the data "1" is executed by using the potential of the signal FBL. Due to this, only the transistor TP4 is used to write the data "1" and it suffices to set the size of the transistor TP4 to W/L. While it is necessary to use the transistor TP2 that constitutes the flip-flop FF1 so as to read the data, it suffices to set the size of the transistor TP2 to W/L. Namely, the sum of areas of the two transistors TP1 and TP4 is 2WL. Therefore, the total area of the transistors TP1 and TP4 according to the first embodiment is a quarter of the total area of the two transistors used to write the data "1" for the conventional sense amplifier S/A. It is to be noted that these are based on simple calculation and sometimes different from actual calculations.

At time t6, the column selection line CSL is activated. The sense nodes SA and bSA corresponding to a selected column are thereby connected to the DQ line and the bDQ line, respectively. The DQ line and the bDQ line are connected to the DQ buffer (not shown). The data is temporarily stored in the DQ buffer and output to the outside from the DQ buffer.

Finally, at time t7, the signals EQL are activated, thereby turning again the sense amplifier S/A into the precharged state.

As stated above, according to the first embodiment, it is only one of the transistors TP3 and TP4 that is used to write the data "1". It is, therefore, possible to reduce occupation areas of the transistors TP1 to TP4. It is thereby possible to reduce the occupation area of the sense amplifier S/A. Because the sense amplifier S/A is provided for every pair of bit lines, reduction in the area of the sense amplifier S/A greatly contributes to downsizing the overall FBC memory device.

According to the first embodiment, the operation for writing the data "1" is executed not by directly using the potential of the sense node but by using the write signal line FBL via the transfer gate TP3 or TP4 that has been turned on by the potential of the sense node. This sense amplifier S/A enables, therefore, writing the data "1" to the memory cell MC with sufficiently high current driving capability.

The above data write operation can be applied to the restoration operation performed during the data read operation, the data write operation, and a refresh operation.

In the first embodiment, the transistors TP3 to TP6 and TN6 to TN9 relevant to the restoration operation (data write operation) are completely disconnected from the transistors TP1, TP2, TN1, and TN2 relevant to the data sensing operation (data read operation). It is, therefore, possible to change the gate length L or gate width W of each of the transistors TP1, TP2, TN1, and TN2 and the transfer gates TGL1, TGL2, TGR1, and TGR2 without considerations to their current driving capabilities during the data write operation.

For example, the gate length L of each of the transistors TP1, TP2, TN1, and TN2 and the transfer gates TGL1, TGL2, TGR1, and TGR2 can be set larger than the conventional gate length to suppress irregularity in threshold voltage. Further, the gate length L of each of the transistors TP3 to TP6 and TN6 to TN9 relevant to the restoration operation can be set to minimum length under design rule. By doing so, the sense amplifier S/A can be robust against the irregularity in threshold voltage among the flip-flops FF1 and FF2 and the transfer gates TGL1, TGL2, TGR1, and TGR2, and the occupation area of the sense amplifier S/A can be reduced.

Meanwhile, if the n-type transistors TN1 and TN2 provided in the flip-flop FF2 operate after the sufficiently great potential difference is generated between the paired sense nodes SA and bSA during the initial sensing operation (t1 to t5), it is unnecessary to make the irregularity in threshold voltage between the transistors TN1 and TN2 so small. In this case, the gate length L of each of the transistors TN1 and TN2 can be set to the minimum length under the design rule. It is, however, preferable to activate the signal bSAN later than the signal SAP.

In the first embodiment, it is premised that the sense amplifier S/As is formed on the SOI substrate. If a body of each of the transistors TP3 to TP6 and TN6 to TN9 relevant to the restoration operation is in a floating state, the current driving capabilities of the transistors TP3 to TP6 and TN6 to TN9 are enhanced. It is, therefore, preferable that the body of each of the transistors TP3 to TP6 and TN6 to TN9 relevant to the restoration operation is in the floating state.

On the other hand, if the body of each of the transistors TP1, TP2, TN1, and TN2 and the transfer gates TGL1, TGL2, TGR1, and TGR2 is in a floating state, then the irregularity in threshold voltage between the paired transistors occurs and the voltage between the source and the drain is lowered. Accordingly, while the body of each of the transistor TP3 to TP6 and TN6 to TN9 is kept in the floating state, the body of each of the transistors TP1, TP2, TN1, and TN2 and the transfer gates TGL1, TGL2, TGR1, and TGR2 can be fixed to predetermined voltage. In this case, it is necessary to form a body contact (not shown) in the body of each of the transistors TP1, TP2, TN1, and TN2 and the transfer gates TGL1, TGL2, TGR1, and TGR2.

Although the first embodiment has been described while attention is paid to the memory cell array MCAL, the same thing is true for the memory cell array MCAR.

Second Embodiment

Figure 5:
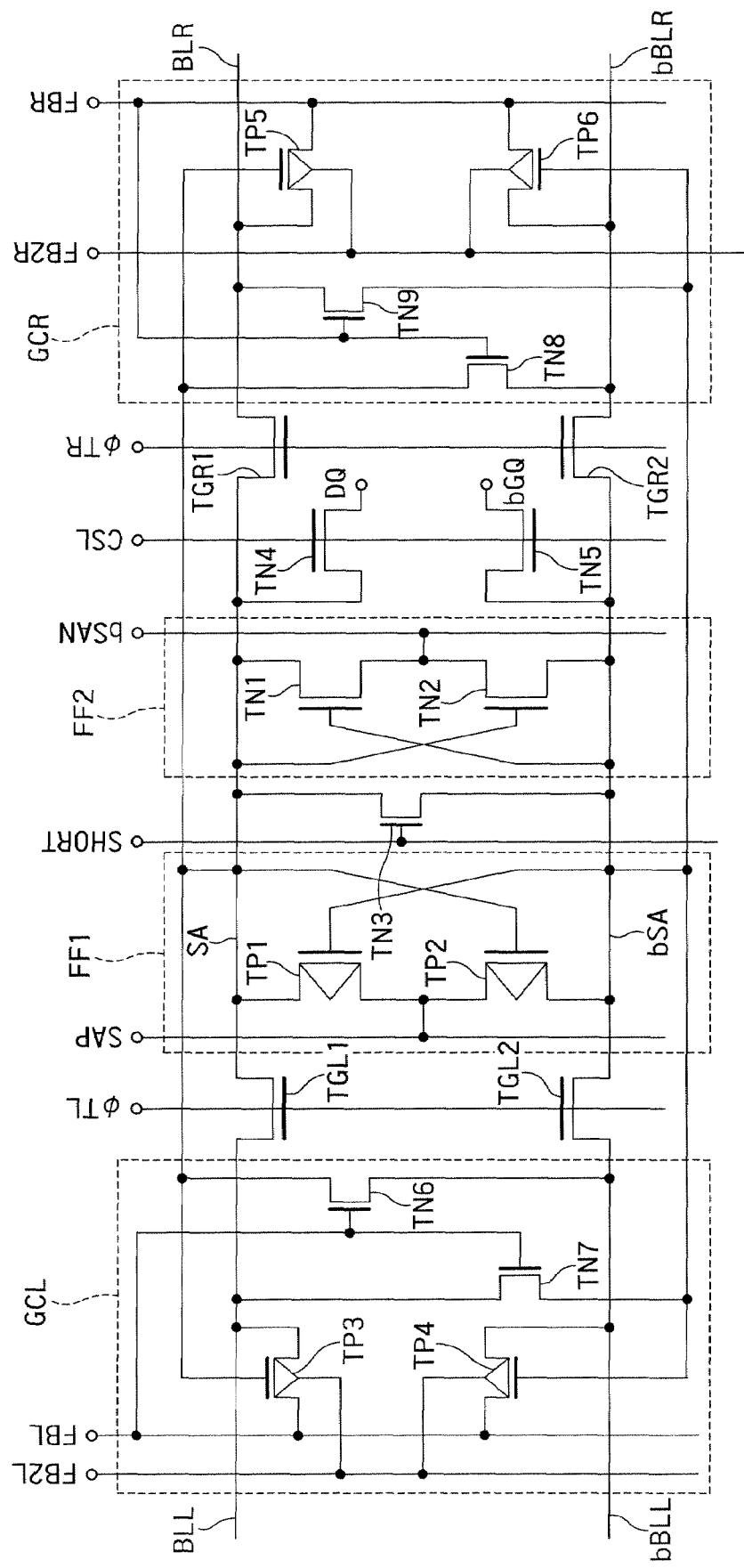
FIG. 5 is a circuit diagram showing a configuration of each of sense amplifiers S/As according to a second embodiment of the present invention.

FIG. 5 is a circuit diagram showing a configuration of each of sense amplifiers S/As according to a second embodiment of the present invention. According to the second embodiment, each of the transistors TP3 to TP6 relevant to a restoration operation includes a body contact. Other constituent elements of the sense amplifier S/A according to the second embodiment can be similar to those of the sense amplifier S/A according to the first embodiment. Bodies of the transistors TP3 and TP4 are connected to a write signal line FB2L and those of the transistors TP5 and TP6 are connected to a write signal line FB2R.

Similarly to the first embodiment, a body contact can be formed in the body of each of the transistors TP1, TP2, TN1, and TN2 and the transfer gates TGL1, TGL2, TGR1, and TGR2 in the sense amplifier S/A according to the second embodiment.

Figure 6:
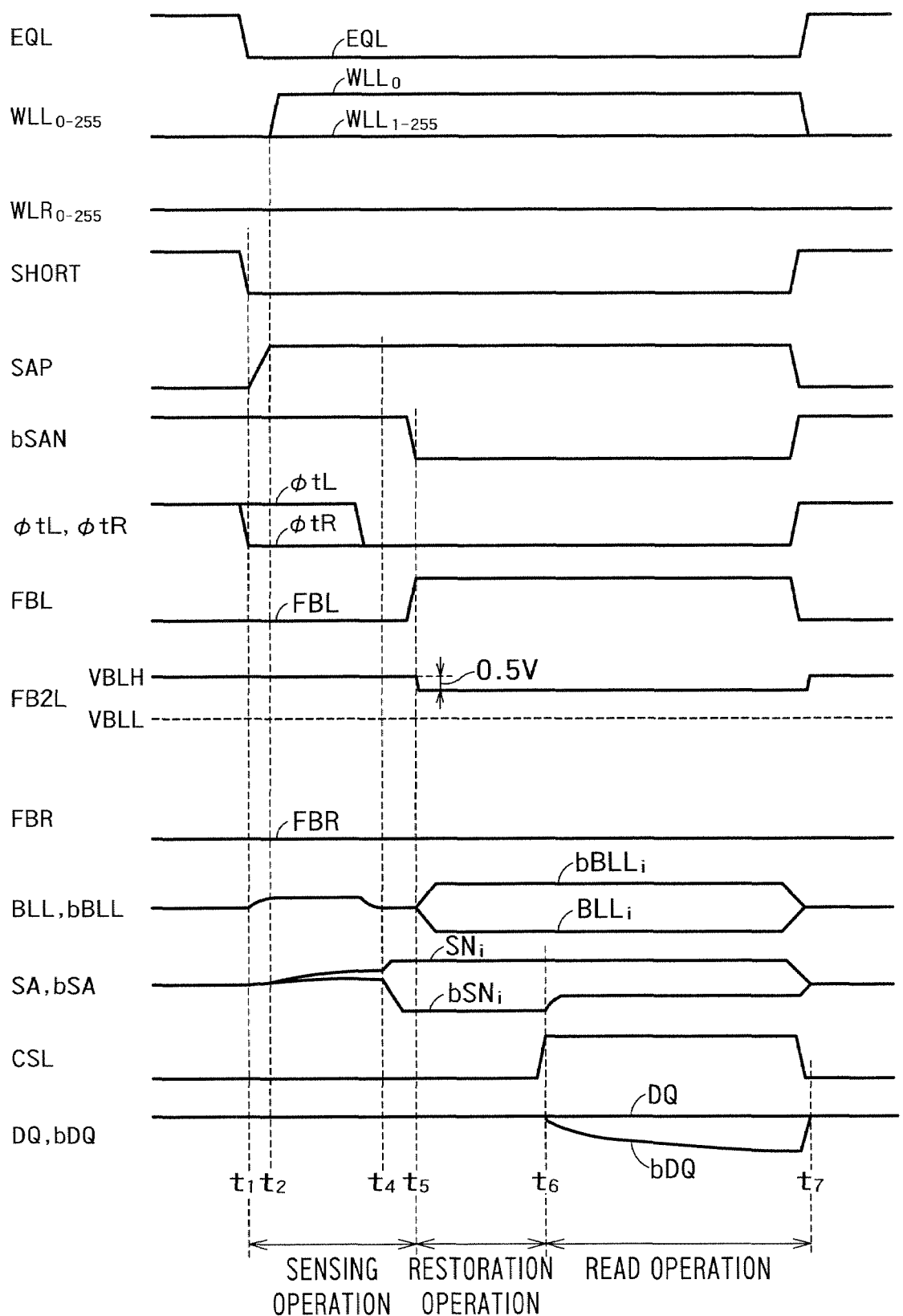
FIG. 6 is a timing chart showing the data read operation performed by each of the sense amplifiers S/As according to the second embodiment.

FIG. 6 is a timing chart showing the data read operation performed by each of the sense amplifiers S/As according to the second embodiment. FIG. 6 differs from FIG. 4 in that a timing of a signal on the write signal line FB2L (hereinafter, "signal FB2L") is added to the timing chart. Operations of the other signals shown in FIG. 6 can be similar to those shown in FIG. 4.

A potential of the signal FB2L is kept HIGH (e.g., VBLH) from the time t1 up to the time t5 and kept to a potential slightly lower (e.g., VBLH−0.5 V) than the HIGH potential level during the restoration operation. The potential of the signal FB2L is between VBLH and VBLL. The VBLH is a potential to be applied to the memory cell MC when data "1" is written to the memory cell MC, and the VBLL is a potential to be applied to the memory cell MC when data "0" is written to the memory cell MC.

By applying a potential slightly lower than the potential VBLH applied to write the data "1" to the body of each of the transistors TP3 and TP4 during the restoration operation, threshold voltages of the transistors TP3 and TP4 can be lowered. As a result, the current driving capabilities of the transistors TP3 and TP4 can be enhanced. Alternatively, the size (W/L) of each of the transistors TP3 and TP4 can be reduced by as much as an increase in its current driving capability. In this case, however, a voltage should be set so as not to turn on a pn-junction between the body and the source of each of the transistors TP3 and TP4.

Third Embodiment

Figure 7:
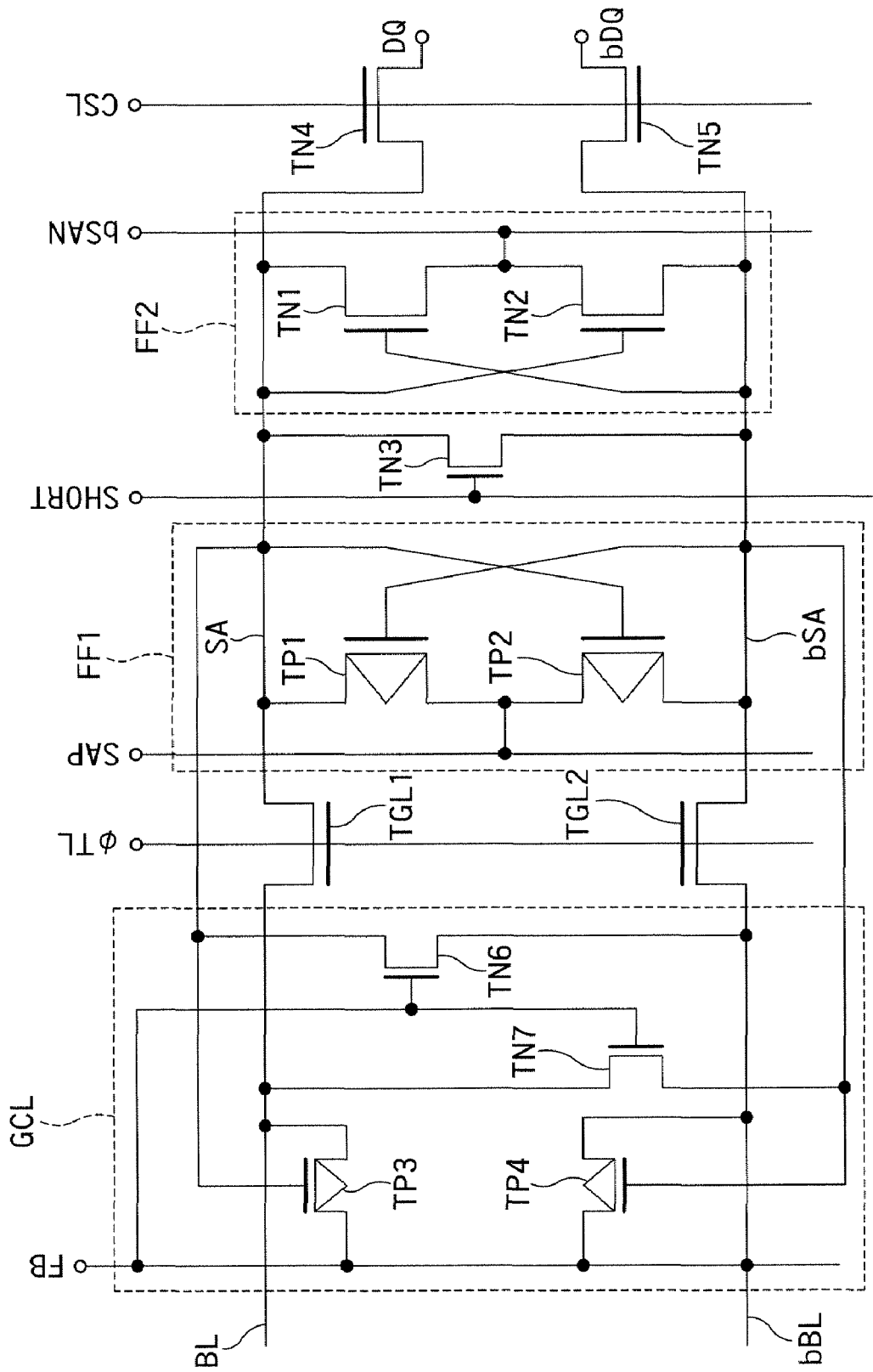
FIG. 7 is a circuit diagram showing a configuration of each of sense amplifiers S/A according to a third embodiment of the present invention.

FIG. 7 is a circuit diagram showing a configuration of each of sense amplifiers S/A according to a third embodiment of the present invention. According to the first and second embodiments, one sense amplifier S/A is shared among the paired bit lines BLL and bBLL and the paired bit lines BLR and bBLR at the left and right of the sense amplifier S/A.

According to the third embodiment, differently from the first and second embodiments, only paired bit lines BL and bBL are connected to one side of the sense amplifier S/A. The present invention is applicable even to the sense amplifier S/A that is not shared among the left and right paired bit lines as shown in the third embodiment. In the third embodiment, it suffices to provide only one gate circuit GCL in the sense amplifier S/A.

Similarly to the first and second embodiments, a body contact can be formed in a body of each of the transistors that constitute the sense amplifier S/A if it is necessary. The size (W/L) of each of the transistors that constitute the sense amplifier S/A can be changed if it is necessary similarly to the first and second embodiments.

Fourth Embodiment

Figure 8:
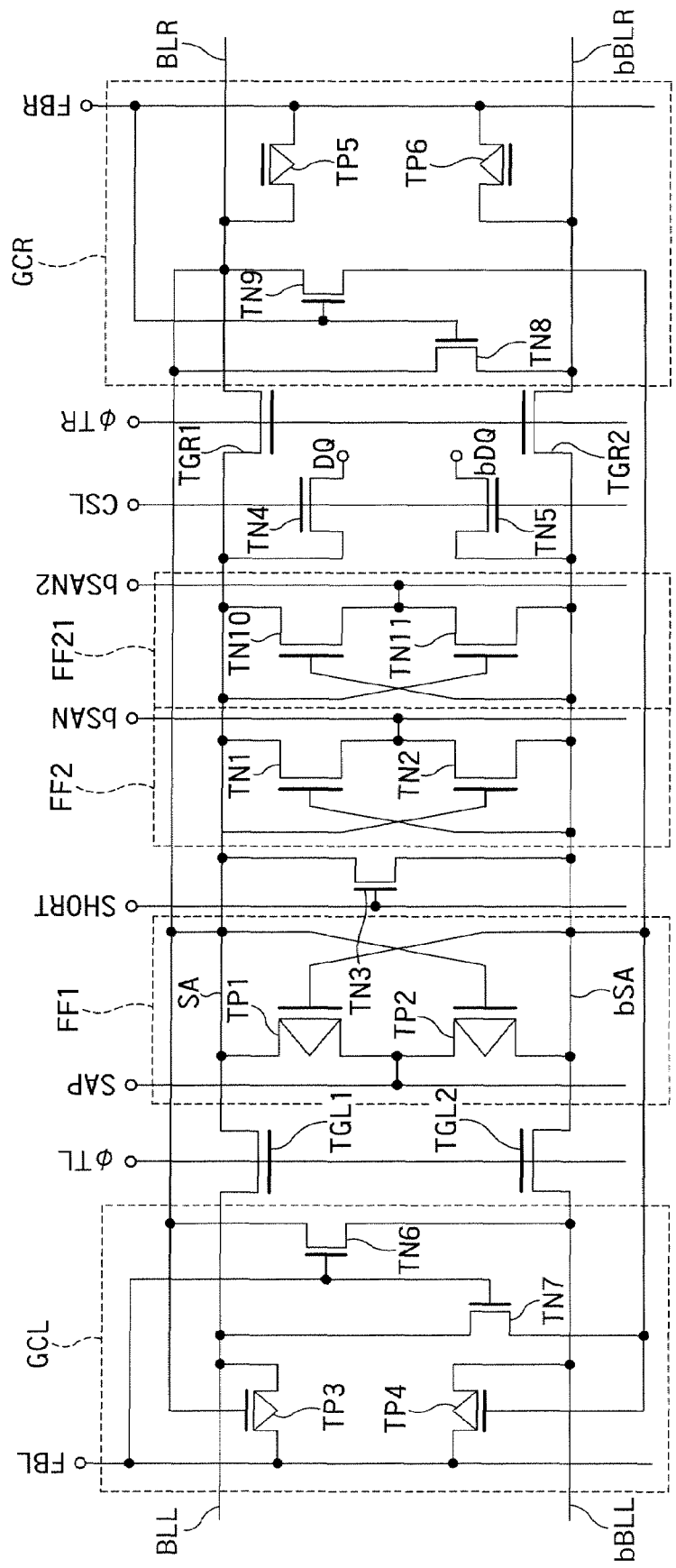
FIG. 8 is a circuit diagram showing a configuration of each of sense amplifiers S/A according to a fourth embodiment of the present invention.

FIG. 8 is a circuit diagram showing a configuration of each of sense amplifiers S/A according to a fourth embodiment of the present invention. The fourth embodiment differs from the first embodiment in that the sense amplifier S/A includes not only the flip-flops FF1 and FF2 but also a flip-flop FF21. The flip-flop FF21 is constituted by two n-type transistors TN10 and TN11 connected in series between the sense nods SA and bSA. A gate of the transistor TN10 is connected to the sense node bSA and a gate of the transistor TN11 is connected to the sense node SA. That is, the gates of the transistors TN10 and TN11 are cross-coupled to the sense nodes SA and bSA. The flip-flop FF21 is driven by activating a signal bSAN2. The flip-flop FF21 amplifies a potential difference between the paired sense node SA and bSA and latches the potential difference on the paired sense node SA and bSA. Other constituent elements of the sense amplifier S/A according to the fourth embodiment can be similar to those according to the first embodiment.

The flip-flop FF2 is activated during a data sensing operation to amplify and latch data. The flip-flop FF21 is activated during a data restoration operation. The transistors TN1 and TN2 that constitute the flip-flop FF2 are used to sense the data. Due to this, the gate length L of each of the transistors TN1 and TN2 is set relatively large and the gate width W thereof is set relatively small in view of the irregularity in threshold voltage. On the other hand, because the transistors TN10 and TN11 that constitute the flip-flop FF21 are used to restore data, the gate length L of each of the transistors TN10 and TN11 can be set to minimum length under design rule.

Figure 9:
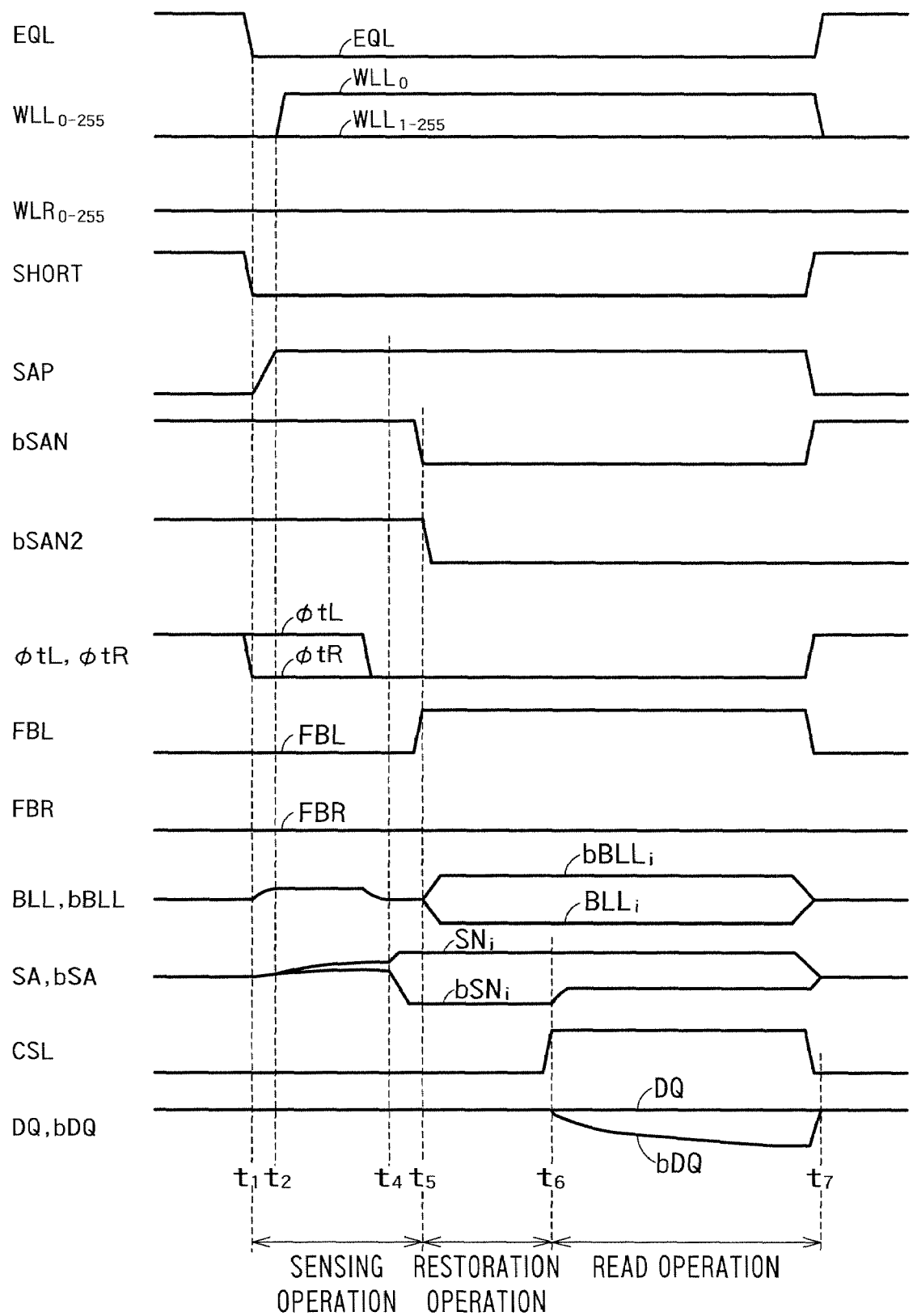
FIG. 9 is a timing chart showing a data read operation performed by the sense amplifier S/A according to the fourth embodiment.

FIG. 9 is a timing chart showing a data read operation performed by the sense amplifier S/A according to the fourth embodiment. The signal bSAN is activated during a latch operation right after an initial sensing operation (t1 to t4). The signal bSAN2 is activated during the data restoration operation (t5) after activating the signal bSAN. Operations of the other signals can be similar those shown in FIG. 4 according to the first embodiment.

A body contact can be formed in a body of each of the transistors that constitute the sense amplifier S/A if it is necessary similarly to the first and second embodiments. The size (W/L) of each of the transistors that constitute the sense amplifier S/A can be changed if it is necessary similarly to the first and second embodiments.

According to the fourth embodiment, by separately providing the flip-flop FF21 necessary to restore data from the flip-flop FF2 necessary to sense data, the size (W/L) of the n-type transistor can be optimized.

Fifth Embodiment

Figure 10:
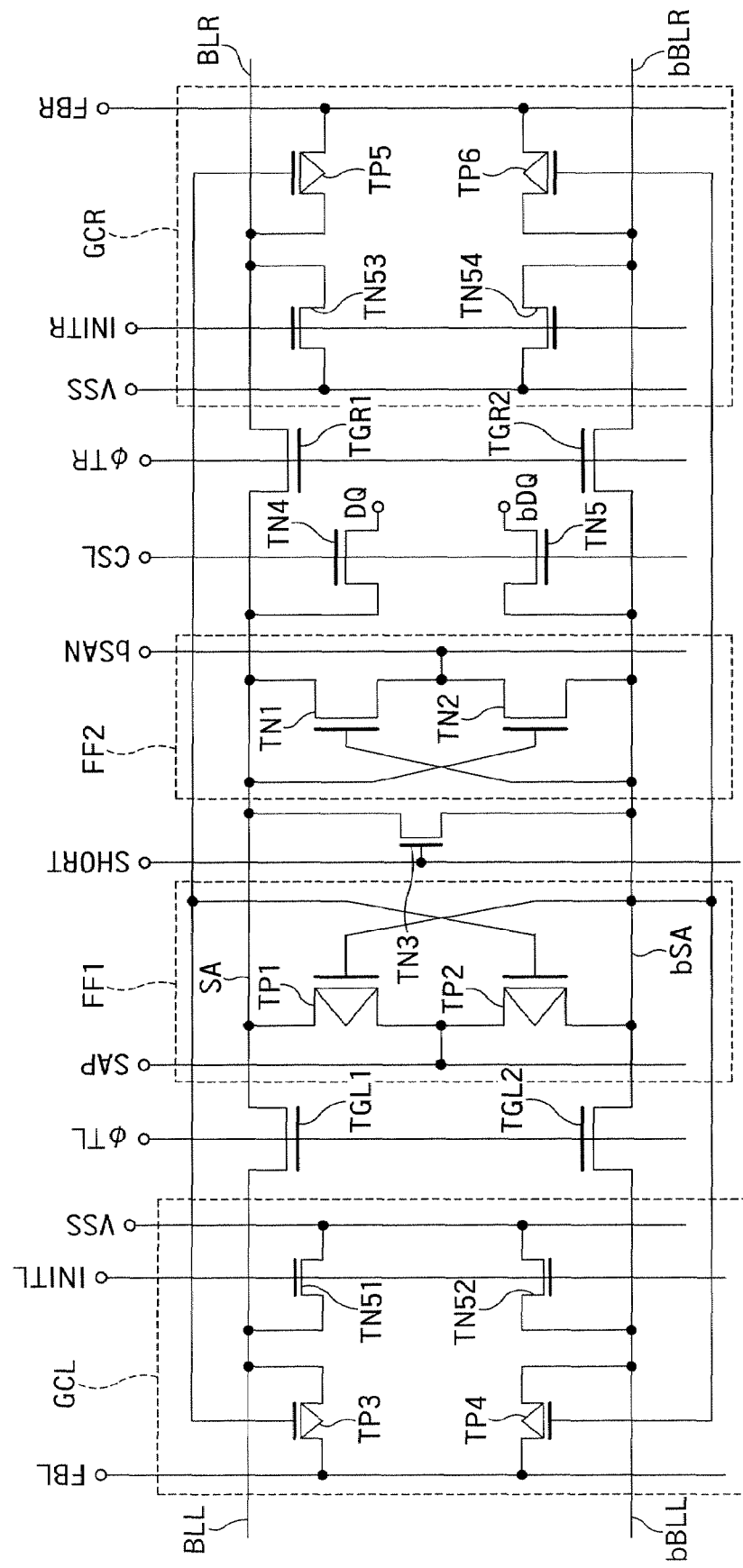
FIG. 10 is a circuit diagram showing a configuration of each of sense amplifiers S/A according to a fifth embodiment of the present invention.

FIG. 10 is a circuit diagram showing a configuration of each of sense amplifiers S/A according to a fifth embodiment of the present invention. The sense amplifier S/A according to the fifth embodiment differs from that according to the first embodiment in that the gate circuits GCL and GCR include n-type transistors TN51 and TN52 and TN53 and TN54, respectively. Other constituent elements of the sense amplifier S/A according to the fifth embodiment can be similar to those according to the first embodiment.

The transistor TN51 is connected between a low potential source VSS and the bit line BLL. The transistor TN52 is connected between the low potential source VSS and the bit line bBLL. The transistor TN53 is connected between the low potential source VSS and the bit line BLR. The transistor TN54 is connected between the low potential source VSS and the bit line bBLR. The low potential source VSS is a potential to be applied to the bit line when data "0" is written and can be set equal to the potential VBLL.

Gates of the transistors TN51 and TN52 are connected to a signal INITL. Gates of the transistors TN53 and TN54 are connected to a signal INITR.

In the first to fourth embodiments, the operation for writing the data "1" is executed using the potential of the write signal line FBL or FBR and that for writing the data "0" is executed by applying the potential of the sense node SA or bSA to the paired bit lines.

According to the fifth embodiment, differently from the first to fourth embodiments, both the operation for writing the data "1" and that for writing the data "0" are executed by applying potentials of the write signal lines FBL and FBR and those of the signal lines INITL and INITR to the paired bit lines, respectively. The potential of the sense node SA or bSA is not used for writing the data "0".

More specifically, if the memory cell array MCAL is selected, for example, the signal line INITL is connected first to both the paired bit lines BLL and bBLL, thereby writing the data "0" to both of the two memory cells MCs connected to the paired bit lines BLL and bBLL, respectively. Thereafter, by connecting the signal line FBL to one of the paired bit lines BLL and bBLL, data "1" is written to the memory cell MC connected to the bit line BLL or bBLL. In this manner, the data "0" and the data "1" are written to the memory cells MCs by performing the two-step data write operation. Namely, after the data "0" is temporarily written to all the memory cells MCs connected to the paired bit lines BLL and bBLL, the data "1" is written to only the memory cells MC in which the data "1" is to be stored. It is to be noted that the operation for writing the data "0" can be instantly completed by turning on a diode between the body and drain of each memory cell MC. In the fifth embodiment, therefore, the two-step data write operation has less influence on a cycle time of the data write operation.

Figure 11:
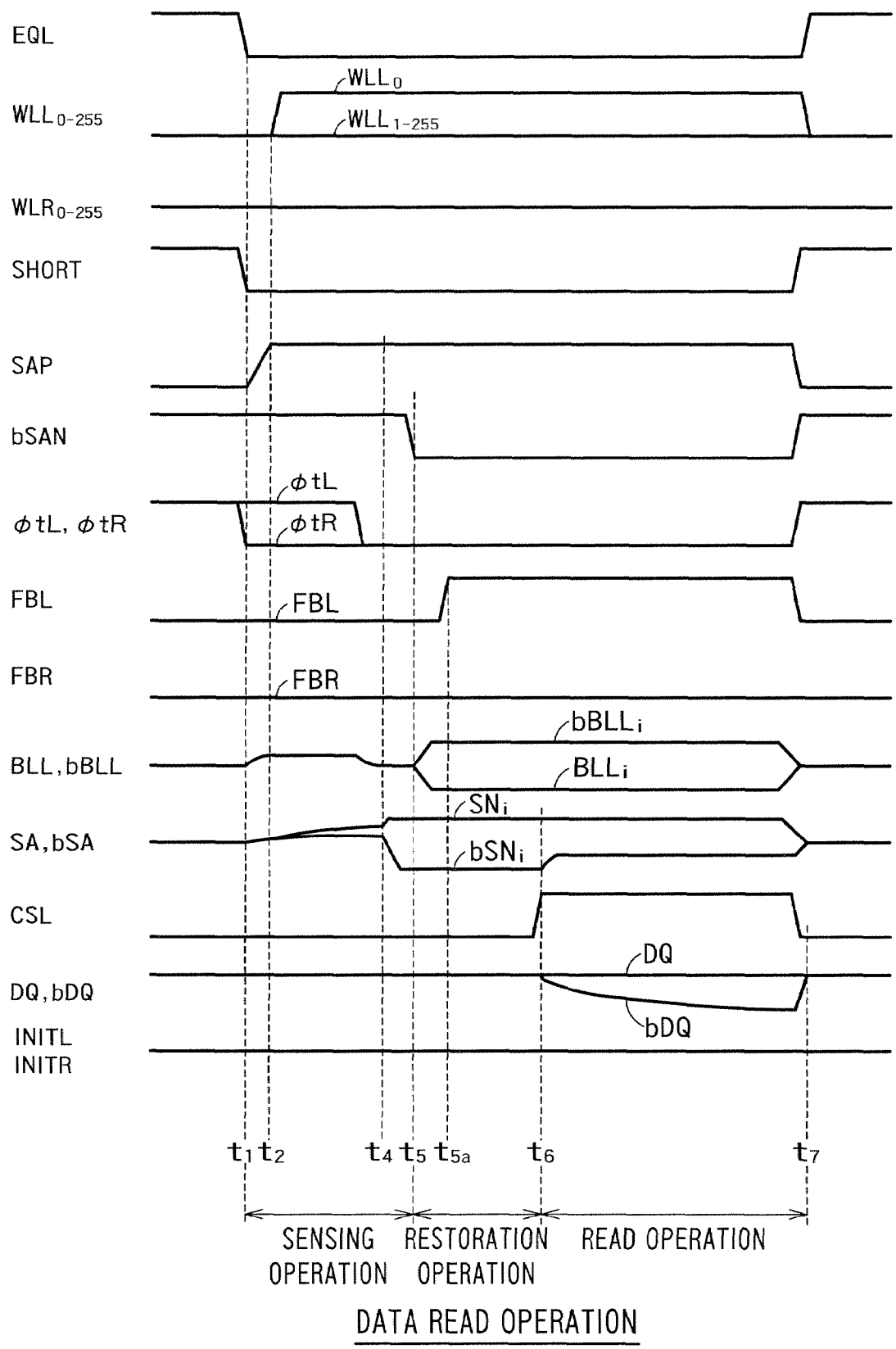
FIG. 11 is a timing chart showing the data read operation performed by the sense amplifier S/A according to the fifth embodiment.

FIG. 11 is a timing chart showing the data read operation performed by the sense amplifier S/A according to the fifth embodiment. In the fifth embodiment, it is assumed that data stored in the memory cells MCs connected to the paired bit lines BLL and bBLL is read. During the data read operation, the signals INITL and INITR are kept inactive (LOW). That is, at this moment, the data "0" is not written to the memory cells MCs.

On the other hand, the data "1" is written to the memory cells MCs by the transistor TP3 or TP4. Namely, during the data read operation, only the operation for restoring the data "1" is performed to suppress change in the data "1" due to charge pumping phenomenon. Other operations performed by the sense amplifier S/A according to the fifth embodiment are similar to those performed by the sense amplifier S/A according to the first embodiment.

Figure 12:
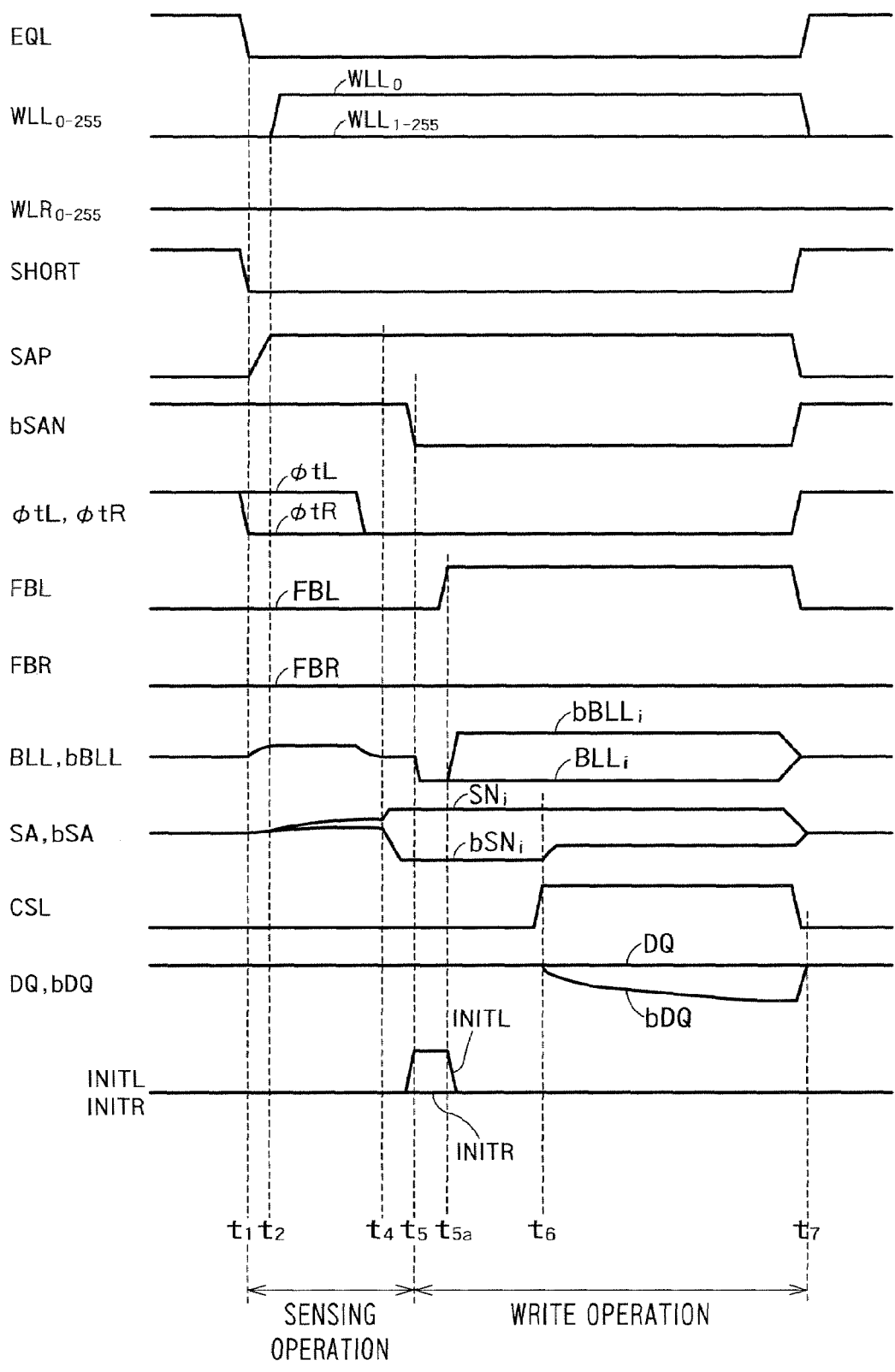
FIG. 12 is a timing chart showing the data write operation or the refresh operation performed by the sense amplifier S/A according to the fifth embodiment.

FIG. 12 is a timing chart showing the data write operation or the refresh operation performed by the sense amplifier S/A according to the fifth embodiment. During the data write operation and the refresh operation, the signal INITL is activated during the data write operation (t5 to t5a). During this period, the data "0" is written to both the memory cells MCs connected to the bit lines BLL and bBLL, respectively.

Next, from the time t5a to the time t7, the signal FBL is activated to HIGH, whereby the data "1" is written to the memory cell MC connected to either the bit line BLL or bBLL. Whether the data "1" is transmitted to the bit line BLL or bBLL depends on the data latched by the sense nodes SA and bSA. For example, during the data write operation, data input from the outside is latched by the paired sense nodes SA and bSA via the DQ buffer. The data "1" is written by turning on one of the transistors TP3 and TP4 based on this latched data. During the refresh operation, read data is once latched by the paired sense nodes SA and bSA. The data "1" is restored by turning on one of the transistors TP3 and TP4 based on this latched data.

Although not shown in FIG. 12, the data input from the outside is often inverted from the read data in the data write operation. In this case, from the time t6 to the time t7, potentials of the DQ line and bDQ line are inverted and those of the bit lines BLL and bBLL are inverted.

As stated above, according to the fifth embodiment, only one of the transistors TN51 and TN52 is used to write the data "0" similarly to the instance where one of the transistors TP3 and TP4 is used to write the data "1". It is, therefore, possible to reduce not only the occupation areas of the transistors TP1 to TP4 but also those of the transistors TN1, TN2, TN51, and TN52. The occupation area of the sense amplifier S/A can be thereby reduced. Because the sense amplifier S/A is provided for every pair of bit lines, reduction in the area of the sense amplifier S/A greatly contributes to downsizing the overall FBC memory device.

According to the fifth embodiment, the operation for writing the data "1" and that for writing the data "0" are executed not by directly using the potential of the sense node but by using the write signal line FBL and the signal INITL. This sense amplifier S/A enables, therefore, writing the data "1" to the memory cell MC with sufficiently high current driving capability, and can ensure taking measures against the charge pumping phenomenon.

In the fifth embodiment, the transistors TP3 to TP6 and TN51 to TN54 relevant to the restoration operation (data write operation) are completely disconnected from the transistors TP1, TP2, TN1, and TN2 relevant to the data sensing operation (data read operation). It is, therefore, possible to change the gate length L or gate width W of each of the transistors TP1, TP2, TN1, and TN2 and the transfer gates TGL1, TGL2, TGR1, and TGR2 without considerations to their current driving capabilities during the data write operation.

For example, the gate length L of each of the transistors TP1, TP2, TN1, and TN2 and the transfer gates TGL1, TGL2, TGR1, and TGR2 can be set larger than the conventional gate length to suppress irregularity in threshold voltage. Further, the gate length L of each of the transistors TP3 to TP6 and TN51 to TN54 relevant to the restoration operation can be set to minimum length under design rule. By doing so, the sense amplifier S/A can be robust against the irregularity in threshold voltage among the flip-flops FF1 and FF2 and the transfer gates TGL1, TGL2, TGR1, and TGR2 and the occupation area of the sense amplifier S/A can be reduced.

Meanwhile, if the n-type transistors TN1 and TN2 provided in the flip-flop FF2 operate after the sufficiently great potential difference is generated between the paired sense nodes SA and bSA during the initial sensing operation (t1 to t5), it is unnecessary to make the irregularity in threshold voltage between the transistors TN1 and TN2 so small. In this case, the gate length L of each of the transistors TN1 and TN2 can be set to the minimum length under the design rule. It is, however, preferable to activate the signal bSAN later than the signal SAP.

In the fifth embodiment, it is premised that the sense amplifier S/As is formed on the SOI substrate. If a body of each of the transistors TP3 to TP6 and TN51 to TN54 relevant to the restoration operation is in a floating state, the current driving capabilities of the transistors TP3 to TP6 and TN51 to TN54 are enhanced. It is, therefore, preferable that the body of each of the transistors TP3 to TP6 and TN51 to TN54 relevant to the restoration operation is in the floating state.

On the other hand, if the body of each of the transistors TP1, TP2, TN1, and TN2 and the transfer gates TGL1, TGL2, TGR1, and TGR2 is in a floating state, then the irregularity in threshold voltage between the paired transistors TP1 and TP2 and that between the paired transistors TN1 and TN2 occur and the voltage between the source and the drain is lowered. Accordingly, while the body of each of the transistor TP3 to TP6 and TN51 to TN54 is kept in the floating state, the body of each of the transistors TP1, TP2, TN1, and TN2 and the transfer gates TGL1, TGL2, TGR1, and TGR2 can be fixed to predetermined voltage. In this case, it is necessary to form a body contact (not shown) in the body of each of the transistors TP1, TP2, TN1, and TN2 and the transfer gates TGL1, TGL2, TGR1, and TGR2.

Although the fifth embodiment has been described while attention is paid to the memory cell array MCAL, the same thing is true for the memory cell array MCAR.

Sixth Embodiment

Figure 13:
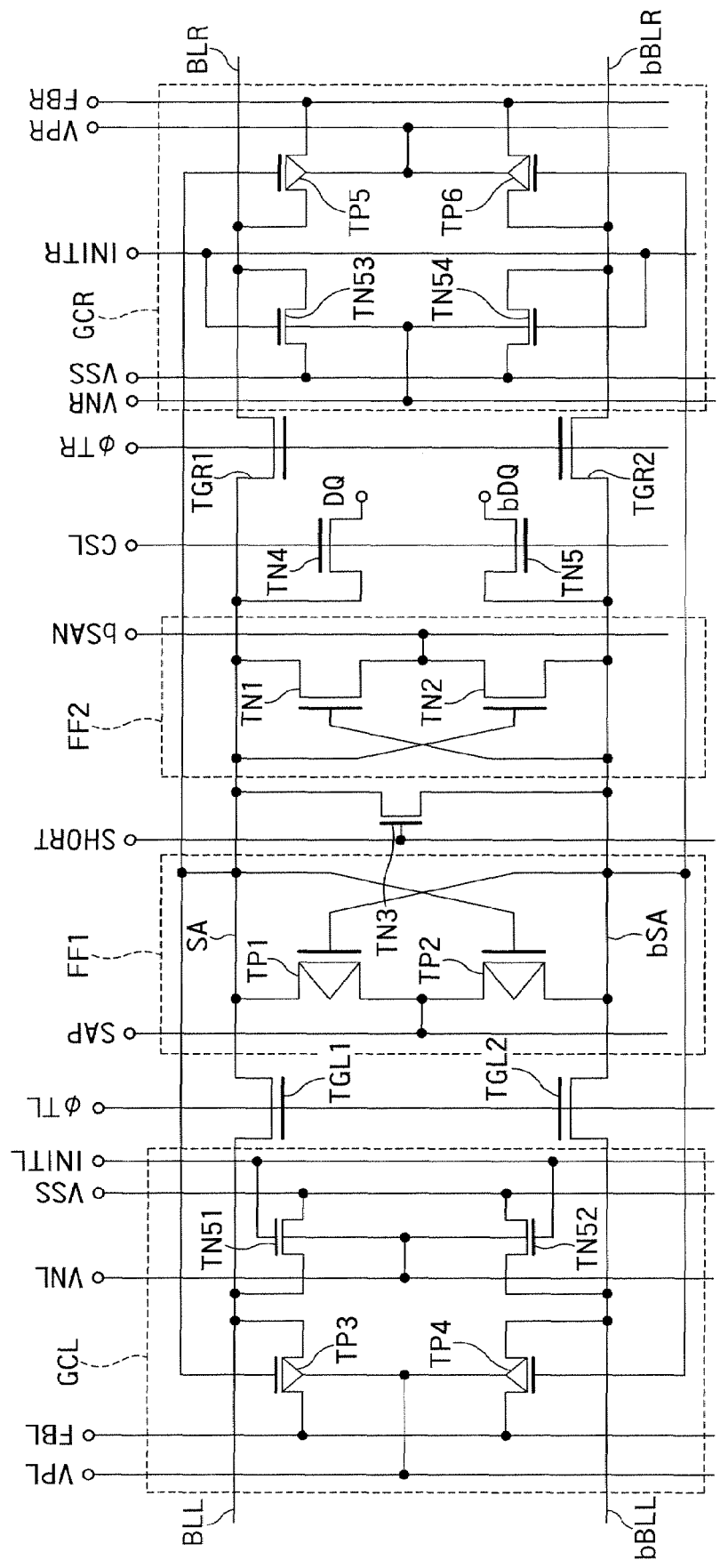
FIG. 13 is a circuit diagram showing a configuration of each of sense amplifiers S/As according to a sixth embodiment of the present invention.

FIG. 13 is a circuit diagram showing a configuration of each of sense amplifiers S/As according to a sixth embodiment of the present invention. According to the sixth embodiment, each of the transistors TP3 to TP6 and TN51 to TN54 relevant to a restoration operation includes a body contact. Other constituent elements of the sense amplifier S/A according to the sixth embodiment can be similar to those of the sense amplifier S/A according to the fifth embodiment. Bodies of the transistors TP3 and TP4 are connected to a signal VPL and those of the transistors TP5 and TP6 are connected to a signal VPR. Bodies of the transistors TN51 and TN52 are connected to a signal VNL and those of the transistors TN53 and TN54 are connected to a signal VNR.

Similarly to the fifth embodiment, a body contact can be formed for the body of each of the transistors TP1, TP2, TN1, and TN2 and the transfer gates TGL1, TGL2, TGR1, and TGR2 in the sense amplifier S/A according to the sixth embodiment.

Figure 14:
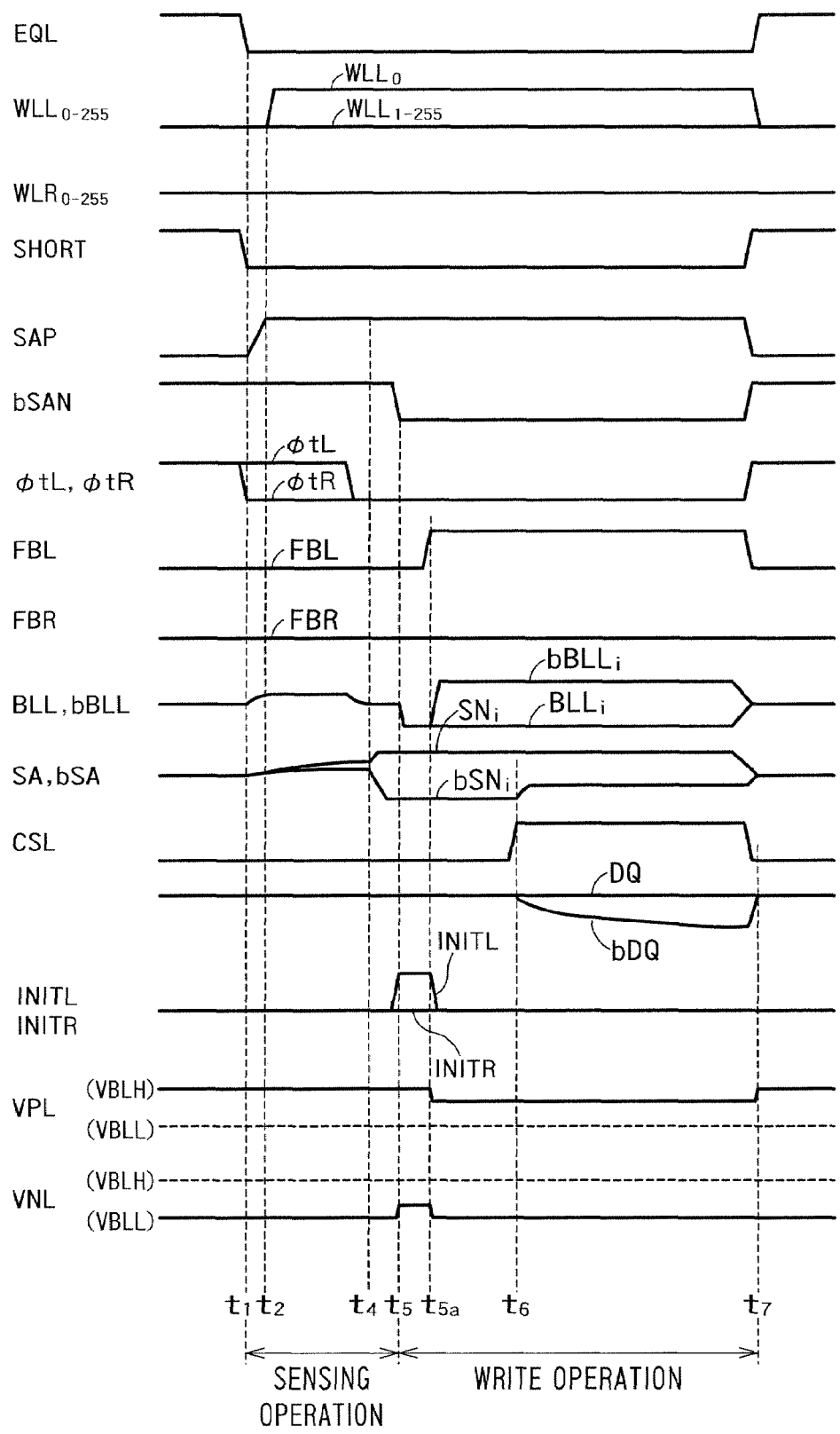
FIG. 14 is a timing chart showing the data read operation performed by each of the sense amplifiers S/As according to the sixth embodiment.

FIG. 14 is a timing chart showing the data read operation performed by each of the sense amplifiers S/As according to the sixth embodiment. FIG. 14 differs from FIG. 12 in that timings of the signals VPL and VNL are added to the timing chart. Operations of the other signals shown in FIG. 14 can be similar to those shown in FIG. 12.

Between the time t1 and the time t5a, a potential of the signal VPL is kept HIGH (e.g., VBLH) and kept to a potential slightly lower (e.g., VBLH–0.5 V) than the HIGH potential level during the restoration operation. The potential of the signal VPL is between VBLH and VBLL. Threshold voltages of the transistors TP3 and TP4 can be lowered by applying a potential slightly lower than the potential VBLH applied to write the data "1" to the body of each of the transistors TP3 and TP4 during the restoration operation. As a result, the current driving capabilities of the transistors TP3 and TP4 can be enhanced. Alternatively, the size (W/L) of each of the transistors TP3 and TP4 can be reduced by as much as an increase in its current driving capability. In this case, however, a voltage should be set so as not to turn on a pn-junction between the body and the source of each of the transistors TP3 and TP4.

Between the time t5 and the time t5a, a potential of the signal VNL is kept to a potential slightly higher (e.g., VBLL+ 0.5 V) than the LOW potential level at the same timing as that of the signal INITL. The potential of the signal VNL at this time is between VBLH and VBLL similarly to the signal VPL. Threshold voltages of the transistors TN51 and TN52 can be lowered by applying a potential slightly higher than the potential VBLL applied to write the data "0" to the body of each of the transistors TN51 and TN52 during the operation for restoring the data "0". As a result, the current driving capabilities of the transistors TN51 and TN52 can be enhanced. Alternatively, the size (W/L) of each of the transistors TN51 and TN52 can be reduced by as much as an increase in its current driving capability. In this case, however, a voltage should be set so as not to turn on a pn-junction between the body and the source of each of the transistors TN51 and TN52.

Seventh Embodiment

Figure 15:
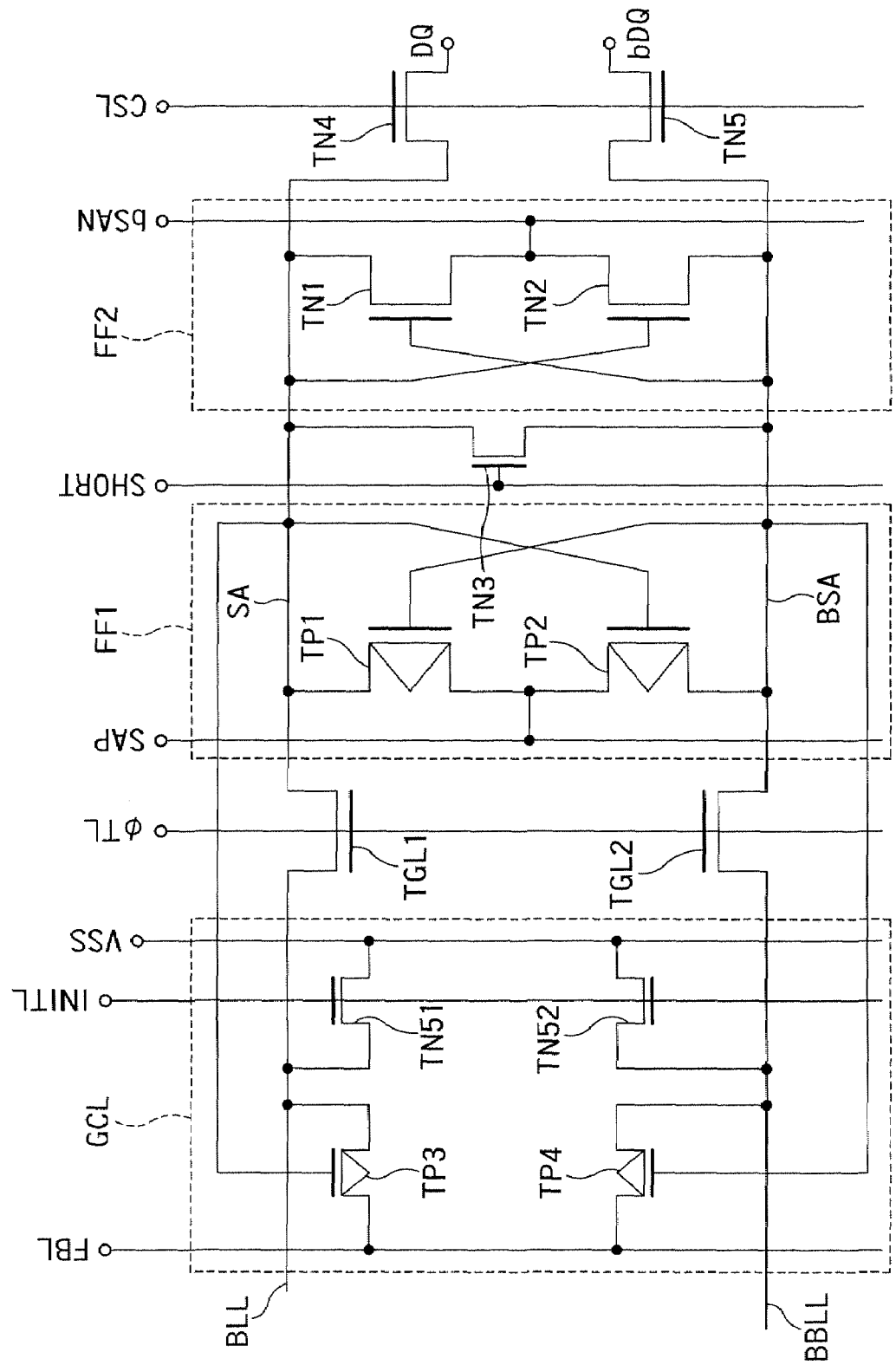
FIG. 15 is a circuit diagram showing a configuration of each of sense amplifiers S/A according to a seventh embodiment of the present invention.

FIG. 15 is a circuit diagram showing a configuration of each of sense amplifiers S/A according to a seventh embodiment of the present invention. According to the fifth embodiment, one sense amplifier S/A is shared among the paired bit lines BLL and bBLL and the paired bit lines BLR and bBLR at the left and right of the sense amplifier S/A.

According to the seventh embodiment, differently from the fifth embodiment, only paired bit lines BL and bBL are connected to one side of the sense amplifier S/A. The present invention is applicable even to the sense amplifier S/A that is not shared among the left and right paired bit lines as shown in the seventh embodiment. In the seventh embodiment, it suffices to provide only one gate circuit GCL in the sense amplifier S/A.

Similarly to the fifth and sixth embodiments, a body contact can be formed in a body of each of the transistors that constitute the sense amplifier S/A if it is necessary. The size (W/L) of each of the transistors that constitute the sense amplifier S/A can be changed if it is necessary similarly to the fifth and sixth embodiments.

Eighth Embodiment

Figure 16:
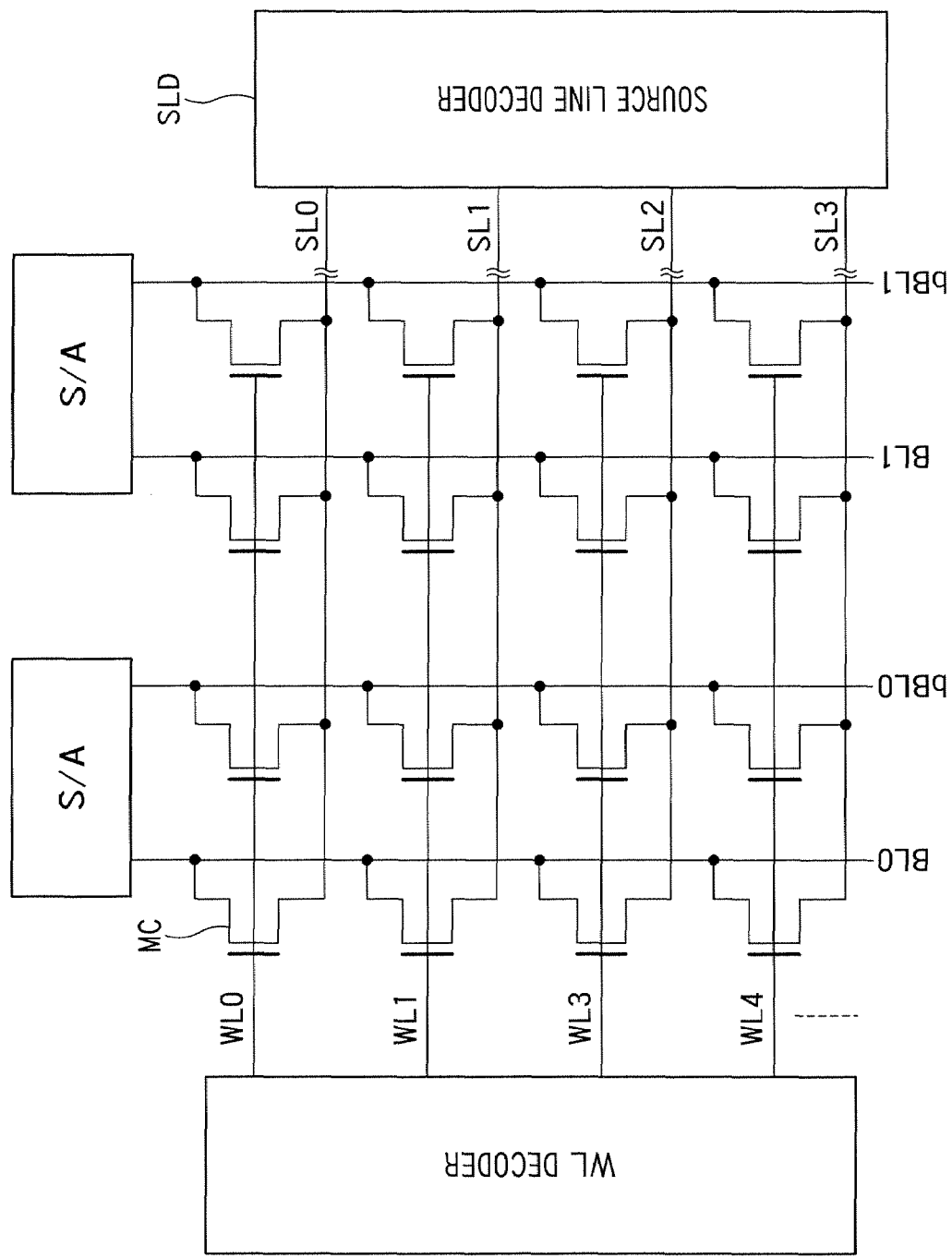
FIG. 16 is a block diagram showing a configuration of an FBC memory device according to an eighth embodiment of the present invention.

FIG. 16 is a block diagram showing a configuration of an FBC memory device according to an eighth embodiment of the present invention. The eighth embodiment differs from the preceding embodiments in that the FBC memory device includes a source line decoder SLD connected to source lines SLs. In the fifth to seventh embodiments, the potential VSS is applied to the bit line to write the data "0" to each of the memory cells MCs. In the eighth embodiment, the source line decoder SLD applies a potential to the source line SL when the data "0" is written to each of the memory cells MCs.

Figure 17:
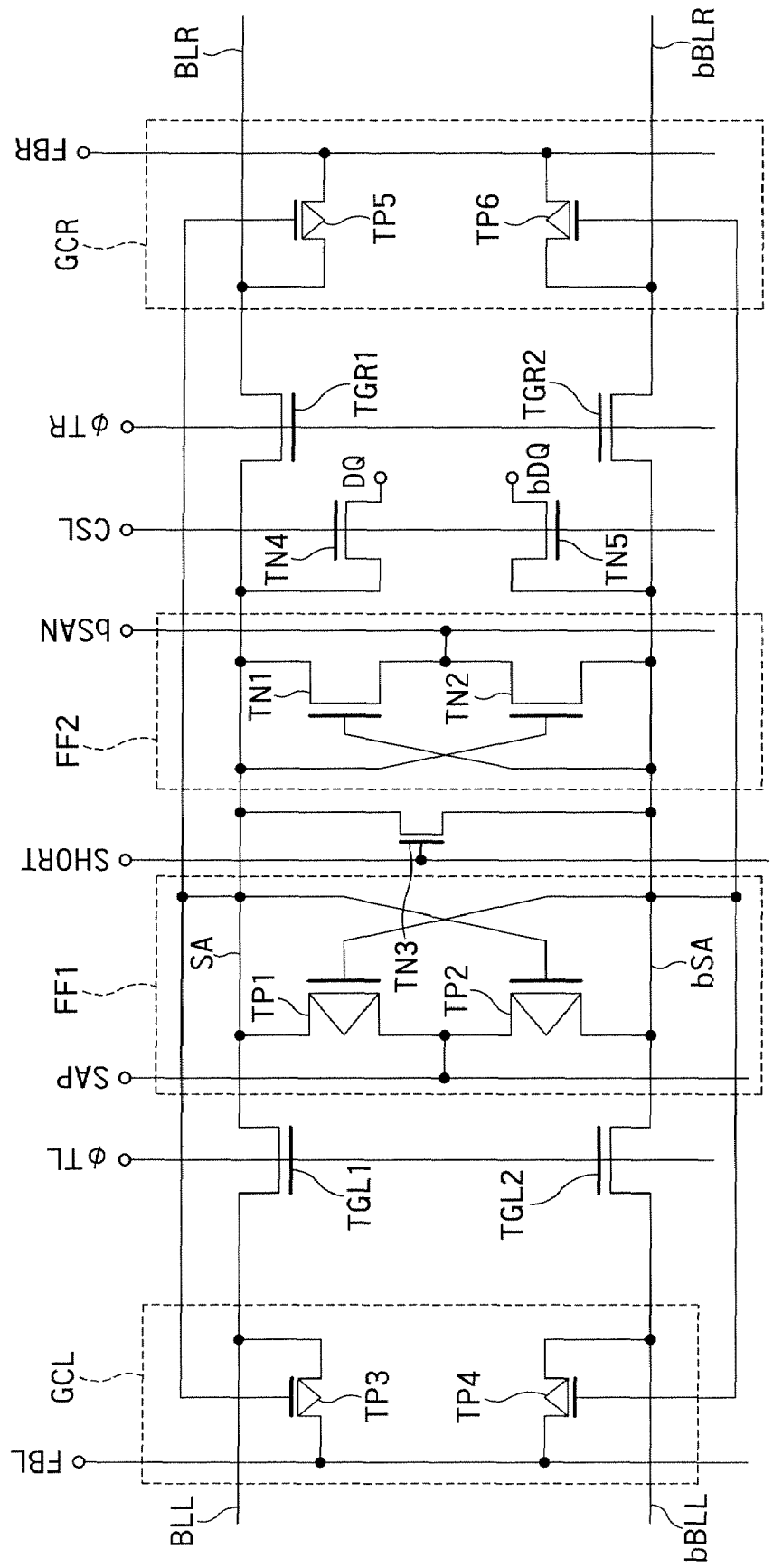
FIG. 17 is a circuit diagram showing a configuration of each of sense amplifiers S/As included in the FBC memory device according to the eighth embodiment.

FIG. 17 is a circuit diagram showing a configuration of each of sense amplifiers S/As included in the FBC memory device according to the eighth embodiment. The sense amplifier S/A according to the eighth embodiment does not include the transistors TN51 to TN54 and the signal lines INITL and INITR used to write the data "0". Other constituent elements of the sense amplifier S/A according to the eighth embodiment can be similar to those of the sense amplifier according to the fifth embodiment.

In the eighth embodiment, similarly to the fifth embodiment, during the data write operation and the refresh operation, the source line decoder SLD writes the data "0" to both of the memory cells MCs connected to the paired bit lines BLL and bBLL, respectively. Next, the transistor TP3 or TP4 writes the data "1" to the memory cell MC connected to the bit line BLL or bBLL according to the potential of the paired sense nodes.

Although the source line decoder SLD is necessary in the FBC memory device according to the eighth embodiment, the configuration of each of the sense amplifiers S/As can be simplified. Therefore, the eighth embodiment is more advantageous if the number of sense amplifiers S/As is large, because the overall FBC memory device can be downsized.

Ninth Embodiment

Figure 18:
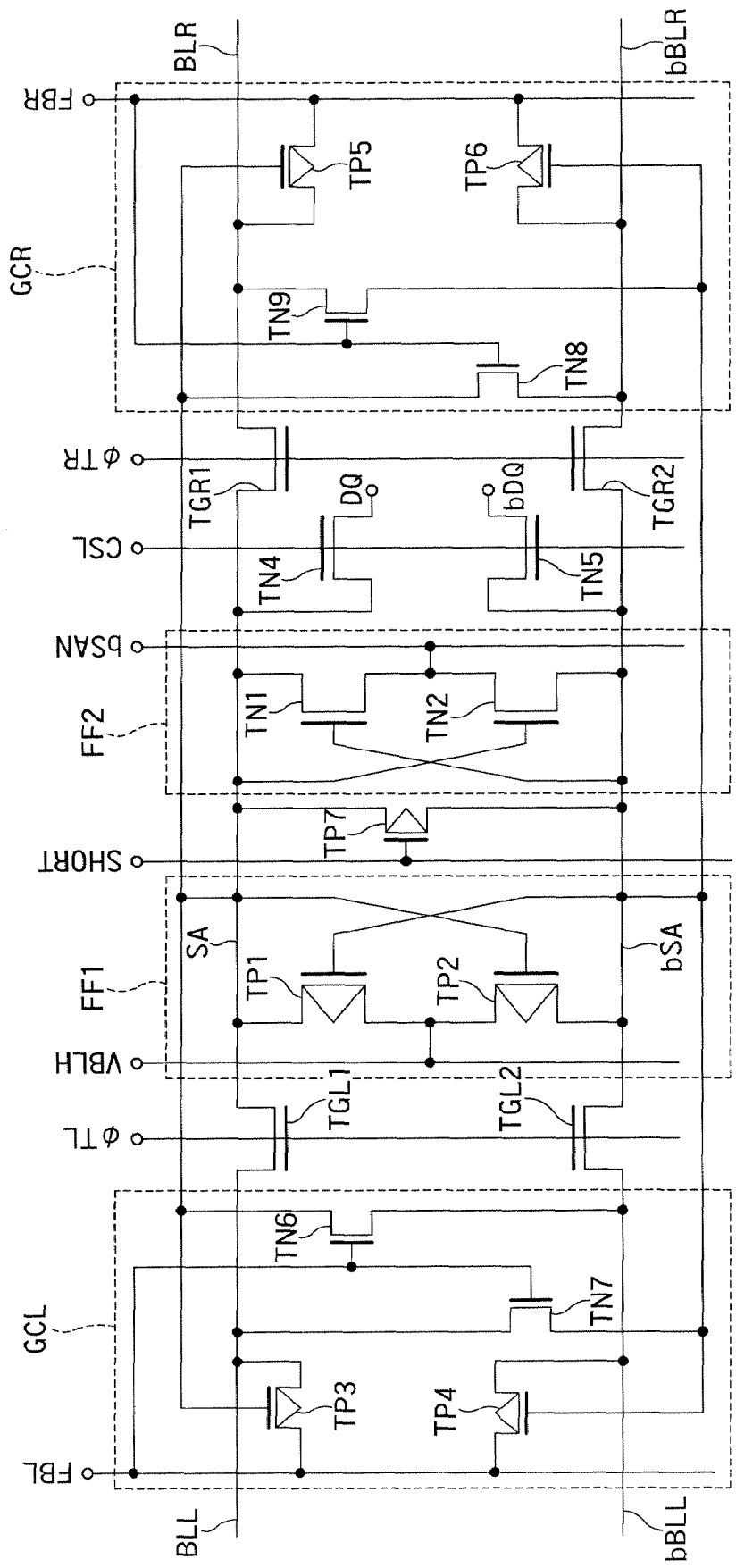
FIG. 18 is a circuit diagram showing a configuration of each of sense amplifiers S/As according to a ninth embodiment of the present invention.

FIG. 18 is a circuit diagram showing a configuration of each of sense amplifiers S/As according to a ninth embodiment of the present invention. The ninth embodiment differs from the first embodiment in that a signal at the potential VBLH (hereinafter, "signal VBLH") instead of the signal SAP is supplied to the flip-flop FF1. The potential VBLH is a high potential to be applied to the bit line BL when the data "1" is to be written. The ninth embodiment further differs from the first embodiment in that the sense amplifier S/A includes a p-type transistor TP7 instead of the n-type transistor TN3. Other constituent elements of the sense amplifier S/A according to the ninth embodiment can be similar to those of the sense amplifier according to the first embodiment.

Figure 19:
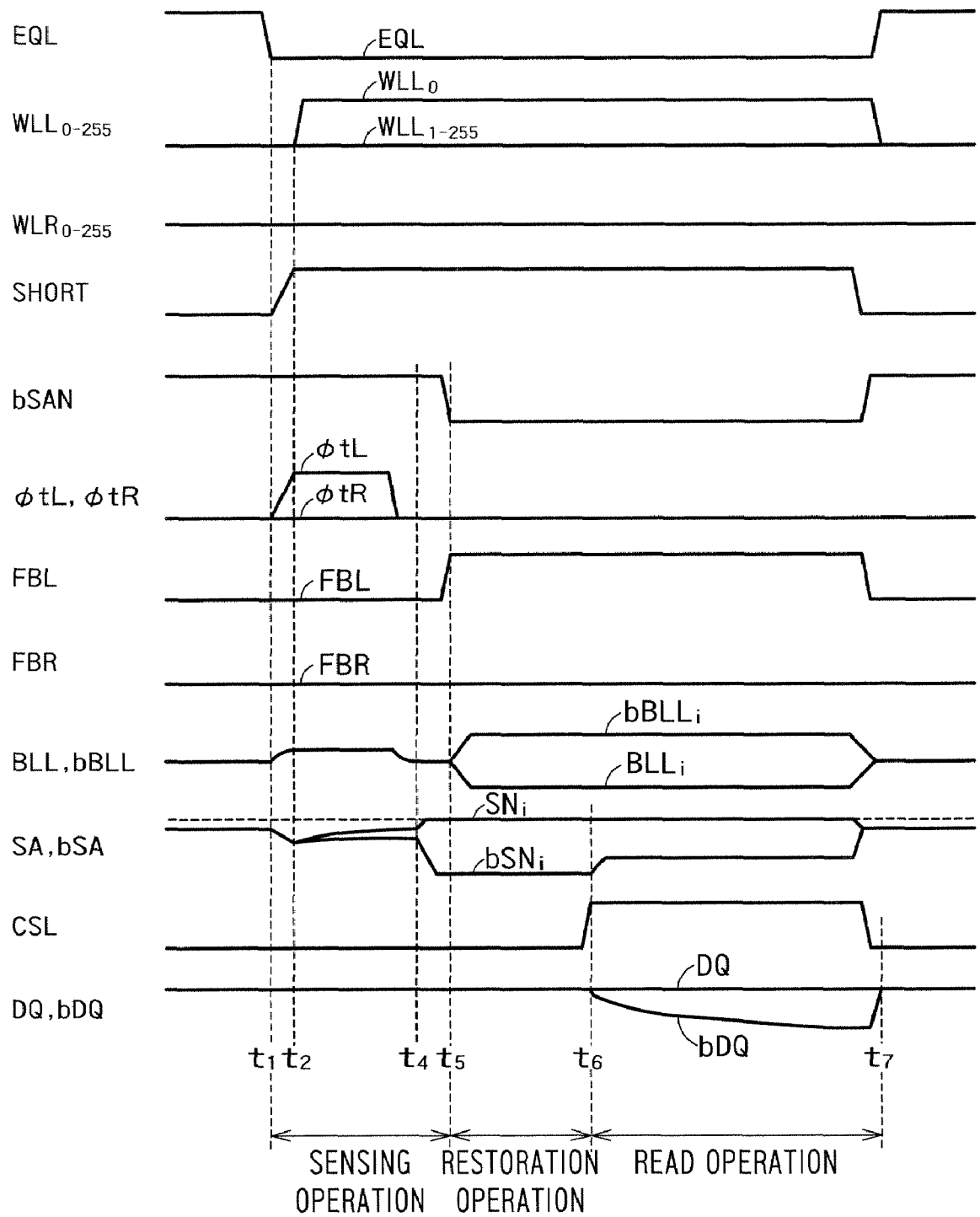
FIG. 19 is a timing chart showing a data read operation performed by the sense amplifier S/A according to the ninth embodiment.

FIG. 19 is a timing chart showing a data read operation performed by the sense amplifier S/A according to the ninth embodiment. The potential levels of signals ΦtL, ΦtR, FBL, and FBR are LOW during a precharge operation and made HIGH when the transfer gates or transistors are turned on during the data read operation.

In the ninth embodiment, the signal VBLH instead of the signal SAP is applied between the transistors TP1 and TP2. The signal VBLH is generally a high potential level signal. Potentials of the paired sense nodes SA and bSA are, therefore, high level before the time 1 and after the time t7.

During the time t1 to the time t2, when the signal ΦtL rises, the paired sense nodes SA and bSA are connected to the paired bit lines BLL and bBLL, respectively. Capacities of the respective paired bit lines BLL and bBLL are thereby added to those of the paired sense nodes SA and bSA, so that the potentials of the paired sense nodes SA and bSA are temporarily lowered. Thereafter, similarly to the first embodiment, current from the current load circuit is applied to the two memory cells MCs via the paired bit lines BLL and bBLL, respectively. The two memory cells MCs connected to the respective bit lines BLL and bBLL store therein data with reversed polarities from each other, so that potential difference is gradually generated between the sense nodes SA and bSA. Subsequent operations are similar to those according to the first embodiment.

The ninth embodiment can exhibit the same advantages as those of the first embodiment. Furthermore, the signal SAP is unnecessary according to the ninth embodiment. An FBC memory device according to the ninth embodiment can, therefore, dispense with a circuit for generating the signal SAP. The circuit for generating the signal SAP includes large-sized elements (not shown) for supplying charges to the paired sense nodes and the paired bit lines. By thus dispensing with the circuit for generating the signal SAP, the overall FBC memory device can be made small in chip size.

The invention claimed is:

1. A semiconductor memory device comprising:
    a memory cell including a floating body in an electrically floating state and storing data according to number of majority carries in the floating body;
    a first bit line and a second bit line connected to the memory cell and transmitting data with reversed polarities from each other;
    a first sense node and a second sense node transmitting the data on the first bit line and the data on the second bit line, respectively;
    a first transfer gate provided between the first bit line and the first sense node;
    a second transfer gate provided between the second bit line and the second sense node;
    a latch circuit provided between the first sense node and the second sense node;
    a write signal line activated when the data is written or written back to the memory cell; and
    a gate circuit connecting the write signal line to the first bit line and the first sense node to the second bit line, or connecting the write signal line to the second bit line and the second sense node to the first bit line, when the data is written or written back to the memory cell.

2. The semiconductor memory device according to claim 1, wherein
    the gate circuit includes
    a first transistor of a first conduction type provided between the first sense node and the second bit line, a gate of the first transistor being connected to the write signal line;
    a second transistor of the first conduction type provided between the second sense node and the first bit line, a gate of the second transistor being connected to the write signal line;
    a third transistor of a second conduction type provided between the write signal line and the first bit line, a gate of the third transistor being connected to the first sense node; and
    a fourth transistor of the second conduction type provided between the write signal line and the second bit line, a gate of the fourth transistor being connected to the second sense node, wherein
    when the data is written or written back to the memory cell, the first transistor and the third transistor are turned on or the second transistor and the fourth transistor are turned on.

3. The semiconductor memory device according to claim 1, wherein
    the gate circuit writes a first state to the memory cell by connecting the write signal line to the first bit line, the first state being a state where the majority carriers are accumulated in the floating body, and the gate circuit writes a second state to the memory cell by connecting the first sense node to the second bit line, the second state being a state where the number of majority carriers in the floating body is smaller than the first state, or
    the gate circuit writes the first state to the memory cell by connecting the write signal line to the second bit line, and writes the second state to the memory cell by connecting the second sense node to the first bit line.

4. The semiconductor memory device according to claim 2, wherein
    the gate circuit writes a first state to the memory cell by connecting the write signal line to the first bit line, the first state being a state where the majority carriers are accumulated in the floating body, and the gate circuit writes a second state to the memory cell by connecting the first sense node to the second bit line, the second state being a state where the number of majority carriers in the floating body is smaller than the first state, or
    the gate circuit writes the first state to the memory cell by connecting the write signal line to the second bit line, and writes the second state to the memory cell by connecting the second sense node to the first bit line.

5. The semiconductor memory device according to claim 2, wherein
    a gate length of a transistor included in each of the first transfer gate, the second transfer gate, and the latch circuit is larger than a gate length of each of the first to the fourth transistors.

6. The semiconductor memory device according to claim 2, wherein
    each of the first to the fourth transistors includes a floating body in an electrically floating state.

7. The semiconductor memory device according to claim 2, further comprising:
    a body potential line applying a potential lower than a potential of the second write signal line to a body of each of the third transistor and the fourth transistor when the data is written or written back to the memory cell.

8. The semiconductor memory device according to claim 1, wherein
    the latch circuit includes
    a first flip-flop (FF2) used to sense the data stored in the memory cell; and
    a second flip-flop (FF21) used to write or write back the data to the memory cell.

9. The semiconductor memory device according to claim 1, further comprising:
    a source line connected to the memory cell; and
    a source line decoder applying a potential to the source line so as to emit majority carriers from the floating body.

* * * * *